United States Patent [19]

Shimomura et al.

[11] Patent Number: 5,404,005
[45] Date of Patent: Apr. 4, 1995

[54] SOLID STATE IMAGING DEVICE AND METHOD OF MANUFACTURING SAME

[75] Inventors: Koji Shimomura, Uji; Yoshikazu Sano, Osaka, both of Japan

[73] Assignee: Matsushita Electronic Corporation, Osaka, Japan

[21] Appl. No.: 132,386

[22] Filed: Oct. 6, 1993

[30] Foreign Application Priority Data

Oct. 6, 1992 [JP] Japan .................................. 4-267098
Oct. 6, 1992 [JP] Japan .................................. 4-267099

[51] Int. Cl.⁶ ...................... H01J 40/14; H01L 27/14
[52] U.S. Cl. .................................. 250/208.1; 250/226
[58] Field of Search .................. 250/208.1, 208.2, 216, 250/226; 257/431, 432, 440, 462

[56] References Cited

U.S. PATENT DOCUMENTS

| | | | |
|---|---|---|---|
| 4,667,092 | 5/1987 | Ishihara | 250/226 |
| 4,764,670 | 8/1988 | Pace et al. | 250/226 |
| 4,786,819 | 11/1988 | Tei | 250/226 |
| 4,827,118 | 5/1989 | Shibata et al. | 257/432 |
| 4,991,936 | 2/1991 | Simons | 250/226 |
| 5,132,251 | 7/1992 | Kim et al. | 257/432 |

FOREIGN PATENT DOCUMENTS

| | | |
|---|---|---|
| 59-099763 | 6/1984 | Japan . |
| 2244101 | 9/1990 | Japan . |
| 4085322 | 3/1992 | Japan . |
| 4334056 | 11/1992 | Japan . |
| 2251978 | 7/1992 | United Kingdom . |

*Primary Examiner*—David C. Nelms
*Assistant Examiner*—John R. Lee
*Attorney, Agent, or Firm*—Yukio Kashiba

[57] ABSTRACT

On the surface of a protecting layer mounted on a solid state imaging devices substrate, transparent gap filler layers and a transparent flattening layer are formed to flatten a surface of overlying protecting layer. On a surface of the transparent flattening layer, color filters of red, blue and yellow are formed. The color filters are made of synthetic photosensitive material. By using the synthetic photosensitive material, the color filters are formed with good shape and precision. All of the color filter show good photo spectrography and uniform characteristics. For the reasons, excellent characteristics of the solid state imaging device are provided which are free form image inferiority caused by flicker, shading, dust and so forth.

23 Claims, 13 Drawing Sheets

SOLID STATE IMAGING DEVICE AND METHOD OF MANUFACTURING SAME

BACKGROUND OF THE INVENTION

1. Field of the Invention

The present invention relates to solid state imaging devices carrying color filters on a top surface of light-receiving sections formed, and manufacturing method thereof.

2. Description of The Related Prior Art

Conventional ways for manufacturing color filters have been dyeing, printing, electro-plating or the like. Dyeing has been widely used, due to its high resolution on color filter patterns and its dyestuff which facilitate attaining a desired photospectrograph. There are two different methods to mount the color filters on the solid state imaging device: an on-wafer method and a filter bonding method. In particular, the on-wafer method, which enables the color filters to be mounted directly on a substrate of the solid state imaging device, has been considered as the mainstream in the field. Keeping these points in mind, combination of the dyeing method and the on-wafer method as mentioned above (referred to hereinafter as the on-wafer dyeing method) is used to form the solid state imagining device with color imaging function.

A description is given below of the solid state imaging device and the manufacturing method thereof featuring the on-wafer dyeing method, with reference of accompanying drawings.

FIG. 33 shows the structure of a prior art solid state imaging device. On a surface of a semiconductor substrate 1, an array of photodiodes or light-receiving sections 2 are arranged at given positions. An insulating layer, transfer electrodes and light-shielding layers are formed on each of transfer sections in the area of the surface of the semiconductor substrate 1 excluding the light receiving sections 2. The surface of the semiconductor substrate 1 is covered with a protecting layer 5. A transparent flattening layer 6 is formed to cover the whole protecting layer 5. Thereafter, color filters 7 are formed. The color filters 7 consists of three different colors: red color filters 7R, green color filters 7G and blue color filters 7B. Bonding pads 3 and scribe lines 4 are formed at an edge portion of the semiconductor substrate 1 of the solid state imaging device.

In forming the color filters 7, the material which is made by combining natural protein such as gelatin or casein and dichromate as a photo-sensitizer with water as a solvent, is evenly applied on the surface of the transparent flattening layer 6 mounted on the protecting layer 5, and then, ultraviolet rays are radiated via desired masks on the material. The unirradiated areas against the ultraviolet rays is dissolved into water to create color filter patterns. Then, the color filter patterns are colored with the dyestuffs containing a desired photospectrography to form the color filter 7. Finally, it is followed by the removal of the transparent flattening layer 6 disposed on the bonding pads 3 and the scribe lines 4 which are used for external line connection of the solid state imaging device. Through all the processes described above, color filters are completed.

In keeping with downsizing of chip size and higher number of pixels, it is generally required to reduce the size of the light-receiving sections included in the solid state imaging device. To achieve this, the color filters 7 need to be minimized. In this instance, it is necessary to make uniform the shape and the photo spectrography of the color filters 7. However, the material made by combining natural protein such as gelatin or casein with dichromate as photo sensitizer, which have been so far employed for the color filters, have a low resolution of patterning. Therefore, it makes the quality of the solid state imaging device carrying the color filters 7 different from device to device. In an attempt to pursuit minuter patterns than the resolution of the material regardless of the flatness of the surface of the solid state imaging device, the color filters 7 are formed with curvature like the pupil as shown in FIG. 33. Consequently, the color filters 7 are overlapped at the edge portions thereof with the adjacent ones, even if flatness on the surface of the solid state imagining devices is made higher. The light traveling through the overlapped parts, therefore, produces irregular image such as mixed color or flickers. Besides, the shape of the surface in the color filters 7, which is curved but not flat, causes the photo spectrography in each of pixels to vary. As a consequence, poor characteristic such as flickers or irregular shading are observed in the solid state imaging device.

The distribution of molecular weight in the natural protein is, even if precisely refined, is hard to be make uniform with high reproducibility. In addition, the natural protein contains an alkali metal such as Na or K of as much as several thousands ppm, which diffuses in the solid state imaging device and increases dark current. Especially in the solid state imaging device, particular pixels with bigger dark current than the surrounding pixels show up as white dots on the picture, which causes white blemish to appear in several weeks after manufacturing the solid state imaging device.

To solve these problems, it is proposed to use a synthetic photosensitive material which have high resolution in Japanese Laid-open publications Nos. 1-142605, 2-96704, 4-163552 and others. According to those publications, synthetic photosensitive materials are synthesized by dissolving a copolymer containing dyeing radicals and a photosensitizer into an organic solvent. According to those methods, color filters are formed by applying the synthetic photosensitive materials, then exposing the materials to ultraviolet rays, and developing the unexposed portions with the organic solvent or a water solution containing the organic solvent as a developer.

In general, if the synthetic photosensitive materials employing the organic solvent are applied to the transparent flattening layers for forming color filters on the surface of the solid state imaging device, transparent flattening layers 6 may be dissolved into the organic solvent so that mixed layers may be formed between the transparent flattening layers 6 and the color filter layers. In this process, after the color filter layers are formed and patterned, it is impossible remove the mixed layers formed in the unexposed areas. Accordingly, when the first of the color filters 7 are formed, the mixed layers experience undesired coloring. Furthermore, when the second or the third color filter 7 are formed, the mixed layers colored during disposition of the first color filters 7 still remain at the interface between the second or the third color filters 7 and transparent flattening layers 6. Accordingly, mixed color appears to invite problems leading to inferior pictures such as flickers.

Speaking the conventional method in more detail, in order to remove the transparent flattening layers 6 mounted on the bonding pads 3 and the scribe line 4, dry etching such as $O_2$ using oxygen plasma is employed. This method produces more particles than the method of removal through exposure and development techniques. Besides, dark current increase due to plasma damage, which in turns causes white blemish. This method, however, provides extremely higher uniformity in thickness of the layer than the conventional method which uses the material consisting of natural protein and a dichromate. It follows that the shape of the color filters are made considerably uniform. As a consequence, the method of forming the color filters through the use of the synthetic photosensitive materials with the organic solvent, is more and more effective as imaging elements in the solid state imaging device become smaller and smaller, because of its higher degree of controllability on patterns.

Thus, irregular or deformed patterns on the color filters 7 deteriorate the characteristics of the solid state imaging device, whereas the method of using the synthetic photosensitive materials for the color filters may solve the above discussed problems but faces another problem of inferior images caused by flickers, particles, white pecks and the like.

Keeping those problems in mind, the present invention is to provide a solid sate imaging device with excellent imaging performance and characteristics, while meeting the demand for downsizing of chip size and a higher number of pixels in the solid state imagining device.

3. Summary of The Invention

To solve the problems described above, an embodiment of the present invention provides a solid state imaging device which comprises a substrate having at least light receiving sections and charge transfer sections, a transparent gap filler layer and a transparent flattening layer mounted on the substrate and color filters of synthetic photosensitive material on the transparent flattening layers.

To solve the problems described above, another embodiment of the present invention provides a method of manufacturing a solid state imaging device which comprises the steps of: preparing a substrate having at least light receiving sections and charge transfer sections; forming light-shield material on the charge transfer sections; covering the light receiving sections and the charge transfer sections with a protecting layer; forming a transparent gap filler layer of photosensitive thermosetting material on the protecting layer in the light receiving sections; forming a transparent flattening layer of photosensitive thermosetting materials on the transparent gap filler layer and the protecting layer in the charge transfer sections; and forming color filters of synthetic photosensitive material with a water solvent, on the surface of the transparent flattening layers. Preferably, the color filters may be formed through light exposure and development techniques.

To solve the problems described above, still another embodiment of the present invention provides a method of manufacturing a solid state imaging device which comprises the steps of: preparing a substrate having at least light receiving sections and charge transfer sections, said substrate further having bonding pads for external connection of the solid state imaging device and a scribe line for separation of the solid state imaging device into individual solid state imaging units; forming light-shield material on the charge transfer sections; covering the light receiving sections and the charge transfer sections with a protecting layer; forming a transparent gap filler layer of positive type photosensitive thermosetting material on the protecting layer in the light receiving sections; forming a transparent gap filler layer of photosensitive thermosetting material in the scribe line and in the bonding pads; forming a transparent flattening layer of photosensitive thermosetting materials on the transparent gap filler layer and the protecting layer in the charge transfer sections; forming color filters of synthetic photosensitive material with a water solvent, on the surface of the transparent flattening layers; and removing the gap filler layer and the transparent flattening layer from the scribe line and the bonding pads. Preferably, the color filters may be formed through radiation exposure and development techniques. The gap filler layer and the transparent flattening layer in the scribe line and the bonding pads may be removed through radiation exposure and development techniques.

In still another aspect of the present invention, a method of manufacturing a solid state imaging device comprises the steps of: preparing a substrate having at least light receiving sections and charge transfer sections, said substrate further having bonding pads for external connection of the solid state imaging device and a scribe line for separation of the solid state imaging device into individual solid state imaging units; forming light-shield material on the charge transfer sections; covering the light receiving sections and the charge transfer sections with a protecting layer; forming a transparent gap filler layer on the protecting layer in the light receiving sections; forming another gap filler layer of photosensitive thermosetting material in the scribe line and in the bonding pads; forming a transparent flattening layer of non-photosensitive thermosetting materials on the transparent gap filler layer and the protecting layer in the charge transfer sections; carrying out heat treatment on the transparent flattening layer; forming color filters of synthetic photosensitive material with an organic solvent, on the surface of the transparent flattening layers; and removing the gap filler layer in the scribe line and the transparent flattening layer on the bonding pads.

In still another aspect of the present invention, a method of manufacturing a solid state imaging device comprises the steps of: preparing a substrate having at least light receiving sections and charge transfer sections, said substrate further having bonding pads for external connection of the solid state imaging device and a scribe line for separation of the solid state imaging device into individual solid state imaging units; forming light-shield material on the charge transfer sections; covering the light receiving sections and the charge transfer sections with a protecting layer; forming a transparent gap filler layer on the protecting layer in the light receiving sections; forming another gap filler layer in the scribe line and in the bonding pads; forming a transparent flattening layer of negative type thermosetting materials on the gap filler layers and the protecting layer in the charge transfer sections; carrying out heat treatment or radiation exposure or both on the transparent flattening layer; forming color filters of synthetic photosensitive material with an organic solvent, on the surface of the transparent flattening layers; and removing the gap filler layer in the scribe line and the transparent flattening layer on the bonding pads.

The above-mentioned synthetic photosensitive material used in the present invention, contains an extremely few amount of alkali metal in its resins and photosensitizer, so that the material is of higher quality as material for color filters, compared with the conventional material made from the natural protein and the dichromate. The synthetic photosensitive material is remarkably slow in dark reaction, so that change in the characteristics with passage of time is a minimum.

The color filter material of the present invention exhibits an excellent resolution of patterning due to the photosensitizer selected, as compared with the material of the natural protein with the dichromate. Besides, although the synthetic photosensitive material with a water solvent is used to form color filters, the appearance of particles and white blemish caused by plasma damage is suppressed down, because etching method is not used in order to remove the transparent flattening layers formed on surfaces of the bonding pads and the scribe lines.

Consequently, the present invention makes it possible to form color filters with highly uniform shape and spectral characteristics on the finely flattened surface of the semiconductor substrate, while meeting the demand for downsizing and a higher number of pixels in the solid state imaging device.

DESCRIPTION OF THE PREFERRED EMBODIMENT

A description will be given of a solid state imaging device in accordance with preferred embodiments of the present invention with reference to the accompanying drawings.

Figure 1:
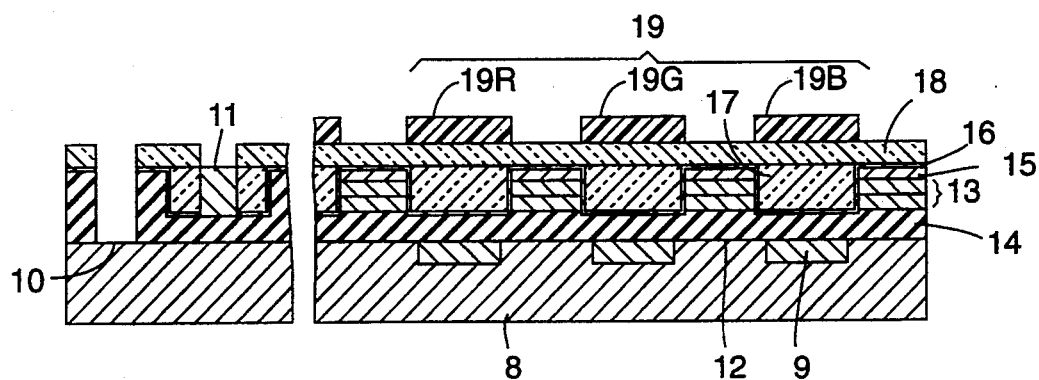
FIG. 1 shows a sectional view of structure in a solid state image device in a first embodiment of the present invention.

FIG. 1 shows a structure of a solid state imaging device in a first embodiment of the present invention. The following will discuss a method of forming a color filter with a water-soluble, negative type synthetic photosensitive material employing water which contains a solvent and a developer and water. The color filters are patterned by means of radiation exposure and development techniques.

On a surface of a P-type semiconductor substrate 8, there are formed N-type light-receiving sections 9 of the solid state imaging device which includes a plurality of solid state imaging units consisting of a number of imaging elements. At the periphery of the solid state imaging devices on the semiconductor substrate 8 there are formed scribe lines 10 which enables those imaging units to be cut and separated off the adjacent units. The bonding pads 11 are formed near the scribe lines 10.

It is noted that the semiconductor substrate 8 has electric charge transfer sections 12 in addition to the light receiving sections. On a surface of the electric charge transfer sections 12 located between two adjacent light-receiving sections 9 on the semiconductor substrate, there are mounted double layer type transfer electrodes 13 with an insulating layer 14 such as SiO2 inserted between the two electrodes. Also, light-shielding metal layers 15 are disposed on a top surface of the transfer electrodes 13 to prevent external light from entering the electric charge transfer sections 12. Besides, protecting layers 16 containing SiO$_2$ are formed on a surface of the light-shielding metal layers 15 and the insulating layer 14.

The level difference or gap between the scribe lines 10 and the protecting layers 16 mounted on the insulating layer 14 is 1.5 thru 2.0 μm, and a gap between protecting layers 16 above the light-receiving sections 9 and the other protecting layers 16 on the light-shielding metals layers 15 is 0.8 through 1.5 μm.

In this case, if an attempt is made to apply the material so as to form color filters 19 on the light-receiving sections 9 directly, a resist material caught by the gaps causes uneven application of the material as if tails were left, thereby resulting in failure to form the color filters 19 with uniform shape.

To solve the above problems, transparent gap filler layers 17 are formed above the light-receiving sections 9 to make it as high as the protecting layers 16 mounted on the light-shielding metals 15.

Also, in order to minimize the gap between the transparent gap filler layers 17 and the protecting layers 16 on the light-shielding metal 15 and flatten the working surface of the solid state imaging device with higher precision, a transparent flattening layer 18 is formed on a top surface of the transparent gap filler layers 17 and the protecting layers 16. Both of the transparent gap filler layers 17 and the transparent flattening layers 18 are formed from the materials which are hardened with heat and positive type photosensitive (referred to hereinafter as the positive type photosensitive thermosetting material).

On the flattening layer 18, color filters 19R, 19G and 18B of red, green and blue are formed to provide the solid state imaging device with color function. Whereas in the drawings the color filter of 19R, 19G, and 19B are arranged at intervals, shading may occur when light travels through the light-receiving sections in which the color filters are not mounted. It is, therefore, preferable to reduce the interval between the color filters a minimum or zero. The color filter 19R, 19G, and 19B are positioned facing the light-receiving sections respectively. With the above arrangement, a single color light impinges on each of the light-receiving sections. According to the present invention, these color filters 19 are made of a synthetic photosensitive material which contains water as a solvent and a developer.

A manufacturing method of the solid state imaging device in accordance with the first embodiment of the present invention is discussed, referring to FIGS. 2 through 13.

Figure 2:
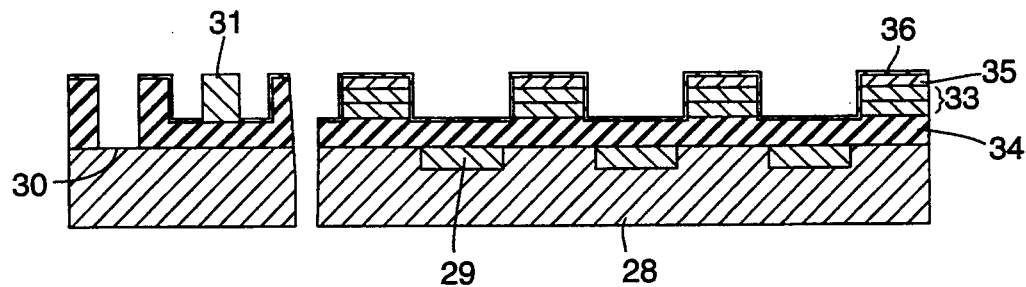
FIG. 2 shows a sectional view of a manufacturing method of the solid state imaging device in accordance with the first embodiment of the present invention.

As shown in FIG. 2, the light-receiving sections 29 are formed by doping an N-type impurity from desired positions on a P-type semiconductor substrate 28 of silicon or the like. On a surface of an insulating layer 34 deposited on the semiconductor substrate 28, bonding pads 31, transfer electrodes 33, and light-shielding metal layers 35 are formed. Protecting layers 36 are also formed on a surface of the light-shielding metal layers 35 and the insulating layers 34.

Figure 3:
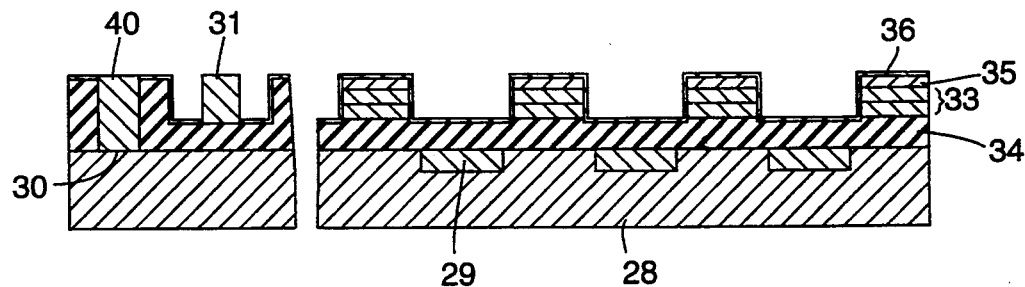
FIG. 3 shows a sectional view of the manufacturing method of the solid state imaging device in accordance with the first embodiment of the present invention.

Then, as shown in FIG. 3, in order to fill the largest gap in the solid state imaging device located between the top surface of the semiconductor substrate 28 in scribe lines 30 and the protecting layers 36, a gap filler layer 40 is formed by means of rotary application. The gap filler layer 40 is rotationally applied up to the same level as the surface of protecting layers 36. Heat treatment is followed for a few minutes at a temperature of 200° C. or higher so as to evaporate a solvent contained in the material and harden the gap filler layer 40. All of the portions excluding the gap on the scribe line 30 are removed by means of radiation exposure and development.

The reason why the gap filler layer 40 is formed in the scribe line 30 is, as seen from the drawings, to flatten the surface of the solid state imaging device by filling rugged surfaces of the substrate due to the disposition of the transfer electrodes 33 and due to the formation of the scribe lines 30. In this case, the gap in the scribe line 30 is larger than that due to the transfer electrodes 33. Accordingly, if an attempt is made once to flatten all of the unevenness of the substrate surface by rotary application, the resist material would have gotten caught by the scribe line 30 having the larger gap, resulting in uneven or irregular application like tails left.

Therefore, these gaps need to be filled in separate processes. The rugged surface in the scribe line 30 is first be flattened. The whole gap filler layer 40 is to be removed at a time in a final step of the manufacturing process along with a polymer mounted on the scribe line 30 and the bonding pads 31 through the radiation exposure and development techniques. To this end, positive type photosensitive thermosetting material is used for the gap filler layer 40. However, the gap filler layer 40 does not need to be colorless and transparent in a visible light range, it is mounted in the scribe line 30 and to be removed in the final step.

In the above illustrated embodiment, a typical example of the positive photosensitive thermosetting material may include polyglycidyl methacrylate and polymethyl methacrylate as its basic structure. Ethyl cellosolve acetate is used as a solvent. Polymethyl methacrylate, when irradiated with far ultraviolet rays like Deep-UV, experiences principal chain scission. Thus, this material shows positive type characteristics. However, it shows low sensitivity to G-rays or I-rays, which is not suitable for patterning.

Figure 4:
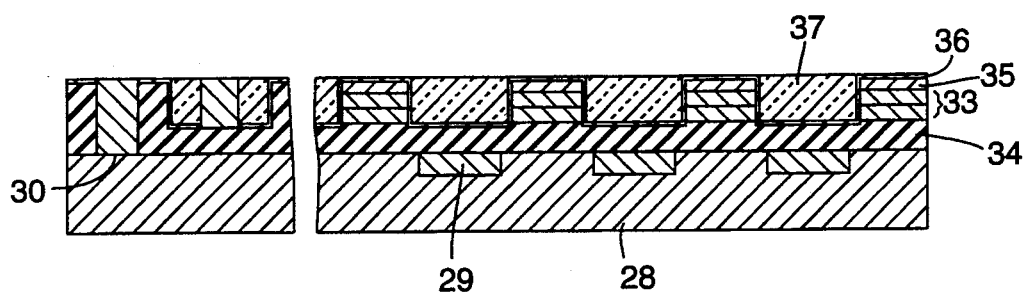
FIG. 4 shows a sectional view of the manufacturing method of the solid state imaging device in accordance with the first embodiment of the present invention.

As shown in FIG. 4, in order to fill the gaps between protecting layers 36 on the insulating layer 34 and the other protecting layers 36 on the light-shielding metal layer 35, the transparent gap filler layers 37 are rotationally applied up to the same level as the surface of the protecting layers 36 on the light shielding metal layers.

Heat treatment is followed for a few minutes at a temperature of 200° C. or higher. The entire transparent gap filler layers 37 except the portions thereof in the gaps is removed by means of exposure and development. The transparent gap filler layers 37 thus formed above the light-receiving sections 29 need to be colorless and transparent in the visible light range. In the illustrated embodiment, the material employed for the gap filler layer 40 is nevertheless colorless and transparent in the visible light range as shown in FIG. 3. The transparent gap filler layers 37, therefore, include the same as the positive type photosensitive thermosetting material employed for the gap filler layer 40.

The other gaps in the imaging units in the solid state image device are all treated in the same process as shown in FIGS. 3 and 4, or will be treated in the same manner as another separate step.

Figure 5:
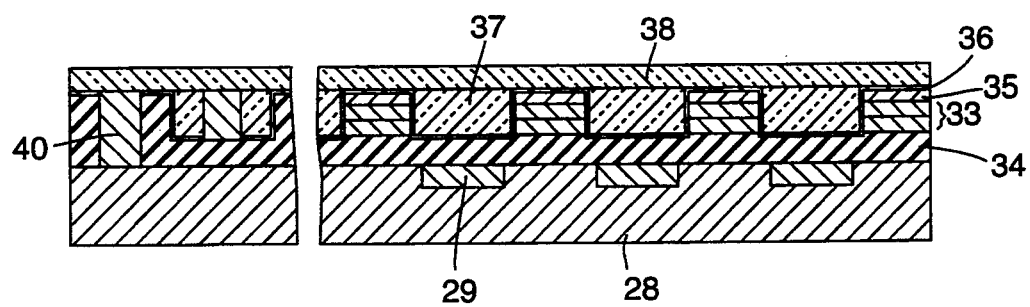
FIG. 5 shows a sectional view of the manufacturing method of the solid state imaging device in accordance with the first embodiment of the present invention.

In the next process, as shown in FIG. 5, in order to bring gaps between the gap filler layer 40 and the transparent gap filler layers 37 with respect to the protecting layer 36 into agreement, both of which are formed in the process shown in FIGS. 3 and 4, a transparent flattening layer 38 of a single layer or multiple layers is formed by rotary application. This flattening layer makes the overall surface of the solid state imaging device flat and free from unevenness. After rotary application of the material for the transparent flattening layer, heat treatment is carried out for a few minutes at a temperature of 200° C. or higher to evaporate a solvent contained in the material. The material used for the transparent flattening layer 38 in this process is the same as the positive type photosensitive thermosetting material used for the gap filler layer 40 and the transparent gap filler layers 37 in the process described above.

The manufacturing steps shown in FIG. 2 through FIG. 5 flatten the gaps between the protecting layers 36 mounted on the light-shielding metal layers 35, the protecting layers 36 covering the insulating layers 34, and a top surface of the semiconductor substrate 28 in the scribe line 30, thereby minimizing the overall gap in the solid state image device to 0.1 $\mu$m or lower.

Figure 6:
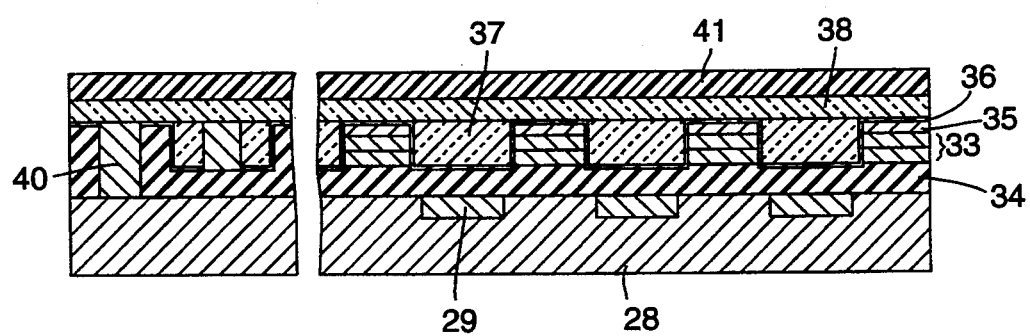
FIG. 6 shows a sectional view of the manufacturing method of the solid state imaging device in accordance with the first embodiment of the present invention.

The next step, as shown in FIG. 6, is to form a color filter base layer 41 on the surface of the transparent flattening layer 38a by means of rotation application employing synthetic photosensitive material to be as thick as approximately 0.3 through 1.0 $\mu$m. Heat treatment is followed at a temperature of 70° C. through 100° C. for a few minutes in order to evaporate a solvent contained in the material. In the process as shown in FIG. 6, it is possible to form the color filter base layer 41 with perfect flatness by rotationally applying the synthetic photosensitive material of highly uniform applicability on the finely flattened transparent flattening layers 38a.

Figure 7:
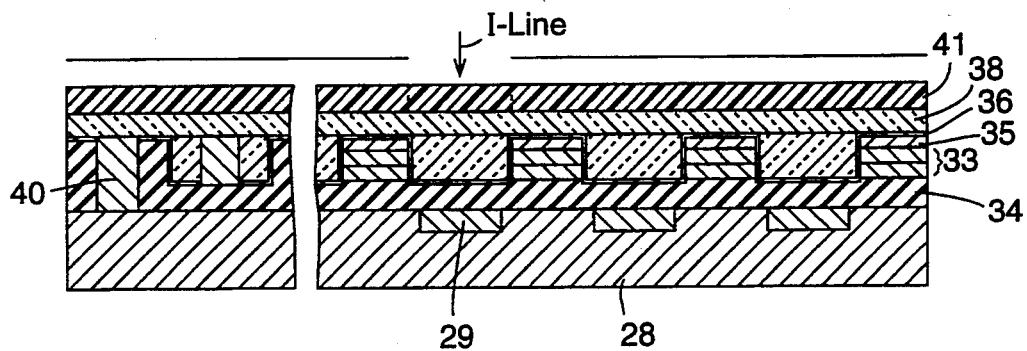
FIG. 7 shows a sectional view of the manufacturing method of the solid state imaging device in accordance with the first embodiment of the present invention.

Then, as shown in FIG. 7, the color filter base layer 41 is exposed to I-rays with desired photo mask patterns. The amount of I-rays radiated was 100 through 200 J/cm.

Figure 8:
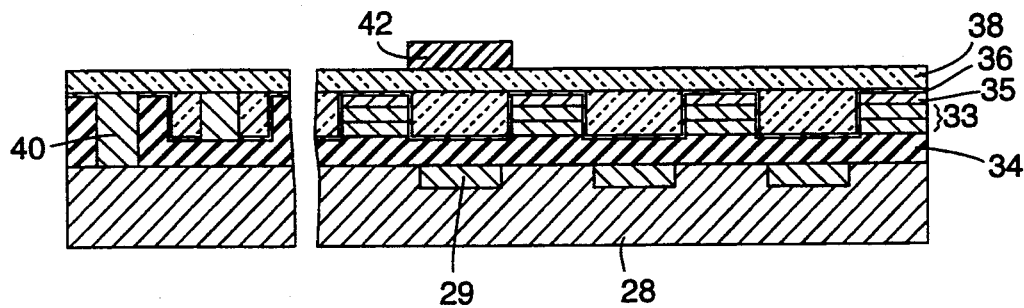
FIG. 8 shows a sectional view of the manufacturing method of the solid state imaging device in accordance with the first embodiment of the present invention.

Subsequently, as shown in FIG. 8, the portion of the color filter base layer 41 which is not with ultraviolet rays is soaked in water as a developer for one minute to be dissolved. After dissolution is over, the developer is removed and heat treatment is effected for a few minutes at a temperature of 130° through 150° C. The temperature in excess of 150° C. would make it harder for dyestuffs to penetrate the color filer 41. Otherwise, the temperature below 130° C. would make it easier for the dyestuffs to come in but the dyestuffs would make patterning rough. The processes described above leads to the formation of a color filter pattern 42.

Figure 9:
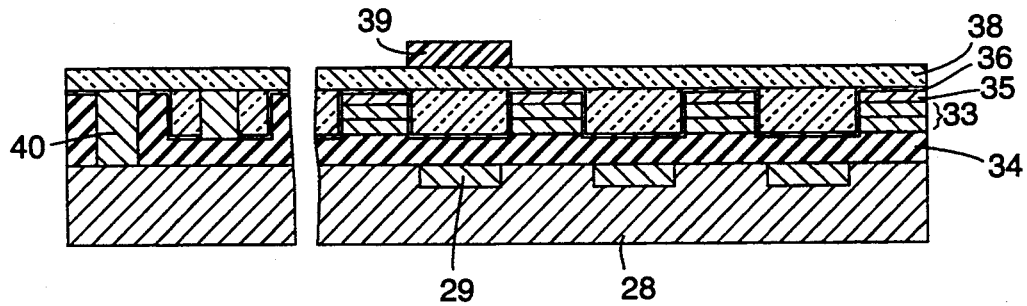
FIG. 9 shows a sectional view of the manufacturing method of the solid state imaging device in accordance with the first embodiment of the present invention.

In the next step, as shown in FIG. 9, the finished color filter pattern 42 are soaked in the dyestuffs and then washed and dried. Dyeing takes place by coupling dying radicals included in the color filter pattern 42 and the dyestuffs, thus creating a color filter 39. In the illustrated embodiment, amino radicals contained in the material are used for dyeing radicals to be discussed in detail later. In connection with the dyestuffs, azo dyestuffs are used for red, xanthene dyestuffs for yellow, and phtalocyanine dyestuffs for blue, respectively.

Once the color filter 39 has been formed, if treated by the fixing method, it will never be mixed with other dyestuffs when being soaked in dyeing liquid in the next dyeing step, as long as a fixing technique is carried out. This fixing technique, for example, is performed by soaking the color filter in an aqueous tannin acid solution and then in an aqueous antimony potassium tratrate solution at a water temperature of 40° C. for a couple of minutes, respectively.

Figure 10:
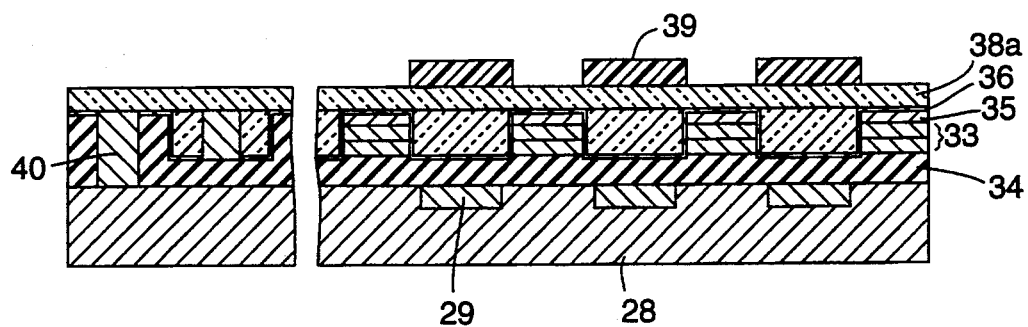
FIG. 10 shows a sectional view of the manufacturing method of the solid state imaging device in accordance with the first embodiment of the present invention.

The next step, as shown in FIG. 10, is to form second and third color filters 39. The above sequence of the steps of FIG. 6 through FIG. 10 is repeated.

The embodiment illustrated in shown in FIG. 6 through FIG. 10 employs the so-called fixing technique, by which the color filter 39 is fixed and hardened after being formed. Alternative approaches to form color filters are a dye-preventing layer method (or a protecting layer method) by which to form dye-preventing layers every time after forming the color filters 39, and a window method by which a color filter pattern 42 is formed uniformly on the transparent flattening layer 38 and a transparent film to protect from color mixture is formed with a window opened for a desired color filter pattern 42 to be dyed.

If the material made of natural protein such as gelatin or casein combined with a dichromate as a sensitizer are employed in the steps of FIG. 6 through FIG. 10, a considerable timewise change would have been observed due to dark reaction during the formation of the color filter. In this instance, even if the steps of application, exposure, development, and dyeing are controlled exactly in terms of minutes, it would be impossible to form the color filter 39 on the solid state imaging device uniformly.

On the other hand, diazo compounds which are employed for the synthetic photosensitive material are considerably slow in timewise or aging change, compared with the dark reaction of the material consisting of the dichromate and natural protein, and hardly experience timewise change during the manufacturing of the color filter 39. Accordingly, the color filer 39 of a single color formed in the solid state imaging device may enjoy excellent uniformity of shape in the solid state imaging device. Moreover, dyeability of the color filter will not change even with change in the material.

For the reasons described above, the color filter 39 of a single color carried on the solid state imaging device through the steps of FIG. 6 to FIG. 10 is highly uniform both in shape and photo spectrography. Therefore, the solid state imaging device is very satisfactory in terms of shading which is caused and affected by irregularity in shape or dispersion of photo spectrography. Whereas flicker characteristics of the conventional color filter of the natural protein and the dichromate show 8 degrees, the color filters formed in the illustrated embodiment of the present invention show 0 through 2 degrees, which means significant improvement in characteristics. While shading characteristics of the conventional color filter point 20 through 30 mV, the illustrated embodiment of the present invention point 15 mV, which is also improvement in characteristics. It is noted that 0 stands for the ideal characteristics both in flicker and shading characteristics.

In the step of FIG. 6, however, if a synthetic photosensitive material with an organic solvent is applied on the transparent flattening layer 38a, the transparent layer 38a may be dissolved into the organic solvent to create a mixed layer of the two materials between the transparent flattening layer 38a and the color filter base layer 41. This is because the positive type photosensitive thermosetting materials for the transparent flattening layer is low in hardness of film and in resistance to organic solvent.

Even in the above illustrated embodiment, polyglycidyl methacrylate used for the transparent flattening layer 38 may experience bridge formation when heat treatment is carried out. Polymethyl methacrylate is, however, slower in bridging reaction due to heat treatment than polyglycidyl methacrylate. Accordingly, polymethyl methacrylate, which is compounded to secure positive type of sensitivity for far ultraviolet rays, lowers film hardness and resistance to organic solvent.

Therefore, in the case where the color filter layer 41 is formed as shown FIG. 6 and then the color filter pattern 42 is formed by means of light exposure, development, and heat treatment as shown in FIGS. 7 and 8, it is impossible to remove the mixed layer developed at the non-exposed areas. Accordingly, when the first color filter 39 is formed in the step of FIG. 9, the mixed layer is colored. Thereafter, when the second or the third color filter 39 is formed in the step of FIG. 10, the mixed layer which is colored during the formation of the first color filter 39 still remains in the interface between the second or the third color filter 30 and a transparent flattening layer 38a. Therefore, color mixture takes place to cause inferior picture including flickers.

However, the present invention employs the material with water as a solvent and a developer for the synthetic photosensitive material, so that the transparent flattening layer 38a is not dissolved with the color filter material, which prevents a mixed layer from being formed. The present invention overcomes problem of inferior image with color mixture caused by the mixed layer colored.

Figure 11:
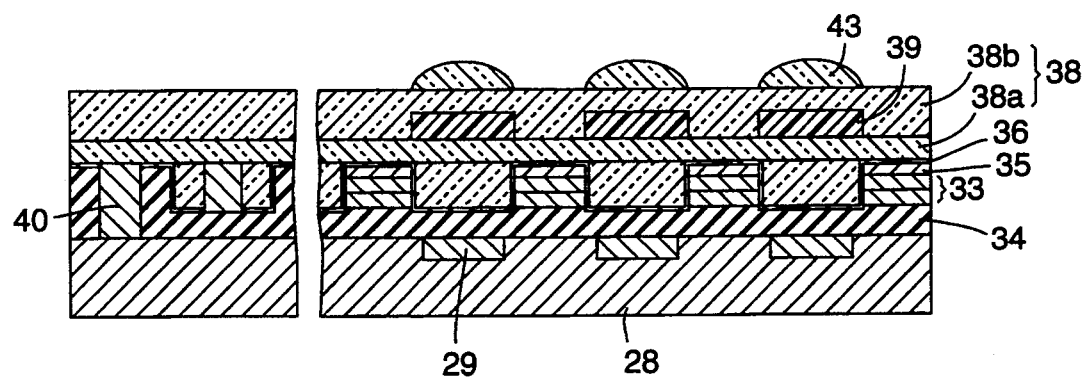
FIG. 11 shows a sectional view of the manufacturing method of the solid state imaging device in accordance with the first embodiment of the present invention.

After all the color filters 39 are formed as shown in FIG. 11, a second transparent flattening layer 38b is formed on a top surface of the color filters 39 by means of rotary application. The heat treatment is followed at a temperature of 200° C. or higher for a few minutes.

It is recognized that both the color filters 39 and the transparent flattening layer 38 are of organic material and excellent in adhesion. It implies that flatness is improved without a gap filler as shown in FIGS. 3 and 4. In case further improvement in flatness is desired, the transparent flattening layers 38 may be repeatedly formed. In the illustrated embodiment, the transparent flattening layer 38 is formed twice. As a result, a gap or level difference is minimized to less than 0.1 μm by the second transparent layers 38. Subsequently, so as to elevate the sensitivity of the solid state imaging device, micro lens 43 are formed on the surface of the second transparent flattening layer 38b.

Figure 12:
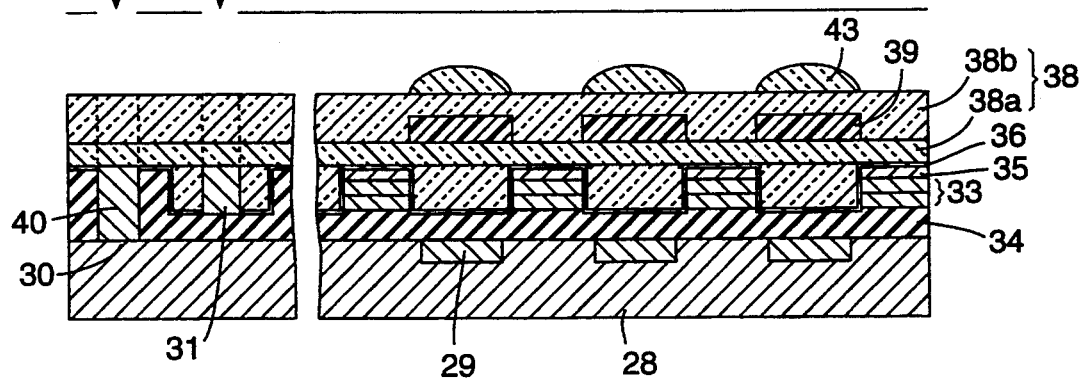
FIG. 12 shows a sectional view of the manufacturing method of the solid state imaging device in accordance with the first embodiment of the present invention.

As shown in FIG. 12, in order to remove the gap filler layer 40 and the transparent flattening layer 38a formed in the scribe line 30 and the transparent flattening layer 38b mounted on bonding pads 31, the solid state imaging device is exposed to far ultraviolet rays with photo masks.

Figure 13:
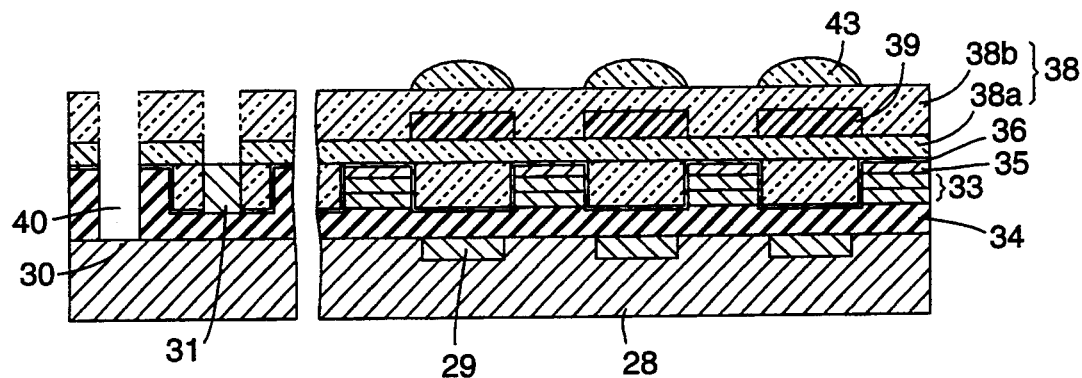
FIG. 13 shows a sectional view of the manufacturing method of the solid state imaging device in accordance with the first embodiment of the present invention.

Finally, as shown in FIG. 13, the gap filler layer 40 and the transparent flattening layer 38 which have been exposed to far ultraviolet rays are dissolved into a mixed liquid of methyl ethyketone and isopropyl alcohol as a developer. The developer is removed after dissolution, and heat treatment is followed at a temperature of approximately 150° C. for a few minutes. By this process, the gap filler layer 40 and the transparent flattening layer 38a formed in the scribe line 30, and the transparent flattening layer 38b mounted on the bonding pads 31 are removed all at a time.

The above steps of FIG. 2 through FIG. 13, complete the formation of an on-chip filter consisting of the color filters 39 and micro lens 43 over the semiconductor substrate 28.

The time for formation of the layers and the time for evaporation of the solvent are well balanced and the layers formed are even and free of rugged surfaces where rotary application is used to form the layers at 1000 through 5000 rotations per minute, through the use of the positive type photosensitive thermosetting materials with an organic solvent consisting of alcohol group and cellosolve group in the steps of FIGS. 2 through 5. In consequence, the gaps in the solid state imaging device between the protecting layers 36 formed over the light-shielding metal layers 35, the protecting layers 36 on an insulating layer 34, and the top surface of the semiconductor substrate 28 in the scribe line 30 are successfully flatted with precision.

In the steps of FIGS. 12 and 13, the gap filler layer 40 and the transparent flattening layer 38 formed on the scribe line 30, and the transparent flattening layer 38 mounted on the bonding pads 31 are removed. These steps prevent problem of uneven application which occurs during rotary application of the color filter material and also thinning of the color filter base layer 41 in the area where gaps are located closely each other as shown in FIG. 6. Similarly, the micro lens 43 formed may enjoy high uniformity of shape. Accordingly, the color filter 39 and micro lens 43 both of which are formed on the flatly formed color filter base layers 41 show excellent uniformity in shape.

In the steps of FIGS. 12 and 13, the gap filler layer 40 and the transparent flattening layer 38a in the scribe line 30 and the transparent flattening layer 38b mounted on the bonding pads 31 are removed by means of exposure and development, which prevents occurrence of particles caused by dry etching, appearance of white blemish due to plasma damage, and thus inferior image. In case of etching with $O_2$, for example, the dark current of the solid state imaging device increases by approximately 3 through 6 mA under the etching conditions of 0.8 through 1.2 Torr for gas pressure, 200 W for high-frequency electric power, 5 through 5 minutes for etching time. However, the illustrated embodiment of the present invention does not experience increasing of dark current due to plasma damage or the appearance of white blemish, because of no etching method used.

A more detail description will be given of the color filters 39 employed in the above illustrated embodiment. The synthetic photosensitive material is used for the color filters 39. If the material of the natural protein such as gelatin or casein compounded with dichromate as a sensitizer is used, a lot of problems would have come up due to the characteristics of the material used: treatment of dichromate used as a sensitizer, dispersion of quality in natural protein, shortness of period of preservation after the dichromate is added to the natural protein.

The natural protein is hard to be refined in quality with uniformity of distribution of molecular weight and high reproducibility. For instance, it is hard to control the difference in value of mean molecular weight between the materials to be as small as 30% or lower. The natural protein contains an alkali metal (for example, Na or K) of as much as several thousands ppm, which diffuses into the solid state imaging device and increases dark current. Especially, the pixels with larger dark current than the surrounding pixels in the solid state imaging device show up as white dots on the picture, which is one of causes of white blemish. This also causes white blemish to appear in several weeks after the manufacturing of the solid state imaging device.

In addition, the material of the natural protein with the dichromate show non-Newtonian characteristics in which viscosity is not in direct portion to power exerted on the material. Therefore, the value of shearing stress which is set according to the number of rotations at the time of rotary application becomes uneven and non-uniform, resulting in difficulty with uniform application of the layers. Furthermore, the natural protein becomes deteriorated in patterning characteristics, dyeing characteristics and fixing characteristics due to heat. Accordingly, it is difficult to form the layers with high uniformity. The characteristics of the resulting color filter 39 in the solid state imaging device are not satisfactory. In addition, the dichromate used as the photosensitizer are harmful to human body and involves problems including the need of special treatment with waste fluid for the environmental protection.

The synthetic photosensitive material used in the above illustrated embodiment exhibits not only both photo sensitivity and hydrophilicity (also hydrophobicity) but also dyeability with or without dyestuffs or pigments bonded or dispersed in the material. For instance, the material may be made dyeable by coupling the material with dyestuffs which includes dyeing power such as Quaternary ammonium salt.

The one actually employed in this embodiment is a dyeable synthetic photosensitive material which is dissolved into water with a solvent of:

an acrylic copolymer consisting of 5–20 weight % of monomer as shown by the following general formula within a range of mean molecular weight from 5000 to 100000

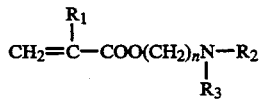

where $R_1$ represents a hydrogen atom or $CH_3$, $R_2$ and $R_3$ represent an alkyl group or allyl group such as $CH_3$, $C_2H_5$, $C_6H_5$ and the like independently, and n represents an integer from 1 to 10; 45–55 weight % of 2-hydroxy ethyl methacrylate; 20–30 weight % of methacrylic amide; and 5–10 weight % of benzylic methacrylate, and oxy poly basic acid salt and a diazo compound.

Like the material of the natural protein compounded with dichromate as photo sensitizer, this synthetic photosensitive material may be patterned by way of water development. Therefore, the above material is free of danger of toxicity, scent, and inflammability due to an organic solvent. It is also safe to human body, because dichromate is not contained in it. There is no need for special treatment with waste fluid, since a double salt such as sulfuric acid, sulfurous acid or the like is used for the counter anion of diazo radicals in place of a double salt such as zinc sulfide.

In addition, the acrylic copolymer provides the color filter 39 with superior durability, due to high film hardness, as compared with other synthetic resin such as polyvinyl alcohol, novolak resin, vinyl family resin or the like. The acrylic copolymer shows nearly 100% of permeability in the visible light range, with no possibility that permeability is lowered when heat treatment is repeated at a temperature of 250° C. or more. In consequence, if the acrylic copolymer is used with the solid state imaging device, it allows more light to enter the light-receiving sections 9 than other compound resins. As a result, the solid state imaging device exhibits a highest sensitivity.

The acrylic copolymer used in the above embodiment may include, as acrylic monomer having dyeing performance as represented by the above formula, N, N-dimethyl amino methacrylate, N, N-dimethyl amino propyl acrylate, acrylic acid diethyl amino ethyl, N, N-dipropyl amino ethyl methacrylate, N, N-dimethyl amino hexy methacrylate, or N, N-dimethyl . . . N-benzylic methacrylate. In this instance, if alkyl group or allyl group increase in the composition, swelling of pattern is a minimum when soaked in dyeing liquid with no or less possibility of cracks.

2-hydroxy ethylmetha acrylate, which is a structural unit of the acrylic copolymer in the above embodiment, elevates adhesion with the transparent flattening layer 38 and promotes the photo bridging reaction. With a too small amount of 2—hydroxy ethylmetha acrylate, light-hardening ability is not sufficient. With a too large amount of it, a number of gel are produced during the manufacturing of the copolymer, leading to the production of so-called resist particles which cause defects on the picture.

Methacrylic amide, which is another structural unit of the acrylic copolymer in the above embodiment, is required to dissolve the acrylic copolymer only with water and to dissolve (or develop) unexposed portions only with water. With a small amount of it, water development can not be expected. With a large amount of it, increased swelling is observed.

Benzylic methacrylate, which is another structural unit of the acrylic copolymer in the above embodiment, restrains the swelling during water development. With a too large amount of benzylic methacrylate, the gel contents of the acrylic copolymer increases.

Oxy poly basic acid salt, which is used for the synthetic photosensitive material in the above embodiment, acts as an assistant to dissolve the acrylic copolymer into water. An example of the oxy poly basic acid salt is malic acid or citric acid or the like.

The synthetic photosensitive material composed as described above shows smaller swelling due to water in the development process than soluble synthetic photosensitive materials of prior art. Accordingly, a high resolution of line-and-space of 1.5 μm wide can be observed in relief patterns, and the rate of residual film is 90% or more. The synthetic photosensitive material, therefore, includes superior characteristics in resolution than casein or gelatin. As for dyeability, the material in the above embodiment manifests dyeing and fixing characteristics to the same extent to which gelatin shows a highest dyeability in the all kinds of the natural protein.

The above description is directed to examples of the color filters having dyeability themselves. In the following, description will be given of an example to employ dyestuffs or pigments for providing the material with dyeability. The synthetic photosensitive material may be combined into coloring materials by bonding or dispersing dyestuffs or pigments having desired photo spectrography. With the coloring materials, the dyeing and fixing step of FIG. 9 can be eliminated.

In addition, the synthetic photosensitive material can be made water-soluble or non-water-soluble, according to methods of combining the material components and choices of materials. Also, the synthetic photosensitive material may be of the negative type light bridge formation type including the natural protein compounded with the dichromate or of the positive type.

The synthetic photosensitive material with water for solvent, used in the above embodiment, manifests the photo bridging type characteristics. As photo bridging type sensitizer, the diazo compounds and azide compounds are known in addition to dichromate. The diazo compounds vary in sensitive wavelength range, heat stability, and choice of bridge-formable polymers according to the structure thereof. It also can be water-soluble or soluble to an organic solution by choosing the kind of a fellow anion. The azide compounds also vary in sensitive wavelength range, heat stability, and choice of bridge-formable polymers, according to the structure thereof. In addition, it shows a highest bridge-formability to non-watersoluble polymers.

Of all of the above materials, the diazo compounds show a higher bridge-forming efficiency for the water-soluble polymer for the color filters and provides high resolution of patterning. This shows superior resolution of patterning, as compared to the color filter materials of the natural protein compounded with the dichromate. For a photo sensitizer to be composed with the synthetic photosensitive materials, any kind of the diazo compound may be employed.

Figure 14:
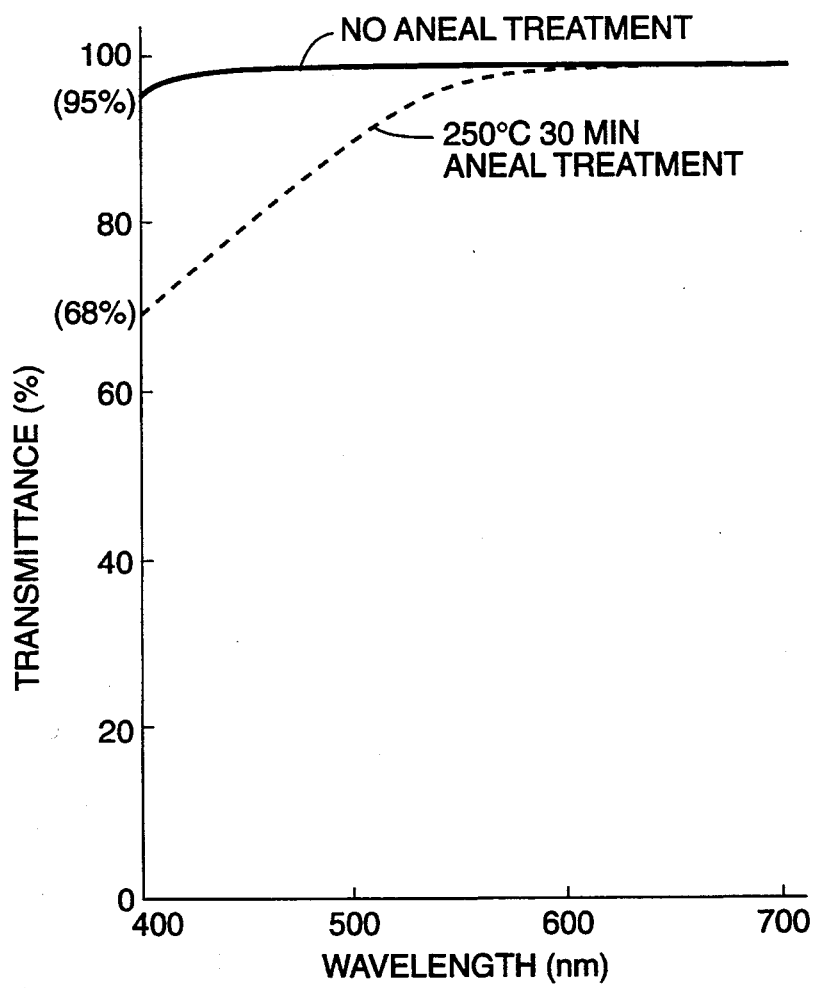
FIG. 14 shows curves of transmission of acrylic copolymer—diazo compound with respect to the wavelength of light.

For example, one of the most effective negative type diazo compounds is a polycondensation product which consists of diphenylamine—4—diazonium salt or its derivative, and formaldehyde. It is noted that the diphenylamine 4—diazonium salt or its derivative contains diphenylamine—4—diazonium salt and/or 3—methoxyl diphenylamine—4 diazonium chloride. FIG. 14 shows change in permeability due to heat treatment in the case where the acrylic copolymer employed in the above embodiment is compounded with 4—diphenylamine sulfate formaldehyde condensation. In this case, a sudden drop of permeability was observed in the first 30 minutes of treatment time during the heat treatment at a temperature of 200° C. or higher. No further change is seen in permeability during the succeeding heat treatment.

After a particular one of the color filter 39 is formed in the steps up to FIG. 10 for the formation of the on-chip filter on the solid state imaging device, heat treatment is repeated in the step of forming the second transparent flattening layer and the micro lens 43 as shown in FIG. 11, in the step of removing the transparent flattening layer 38 and the gap filler layer 40 in the scribe line 30 and the bonding pads 31 shown in FIG. 12 through FIG. 13, and subsequently to the formation of the color filters 39. Once the on-chip filter has been formed, the spectral characteristics of the color filters 39 will not change despite repeated heat treatment. The color filters in the solid state imaging device are thus free from coloring, irregular patterns, nor rough surface due to heat treatment, with help of the diazo compounds composed in the synthetic photosensitive material. Accordingly, the thermal resistance need not be considered.

Figure 15:
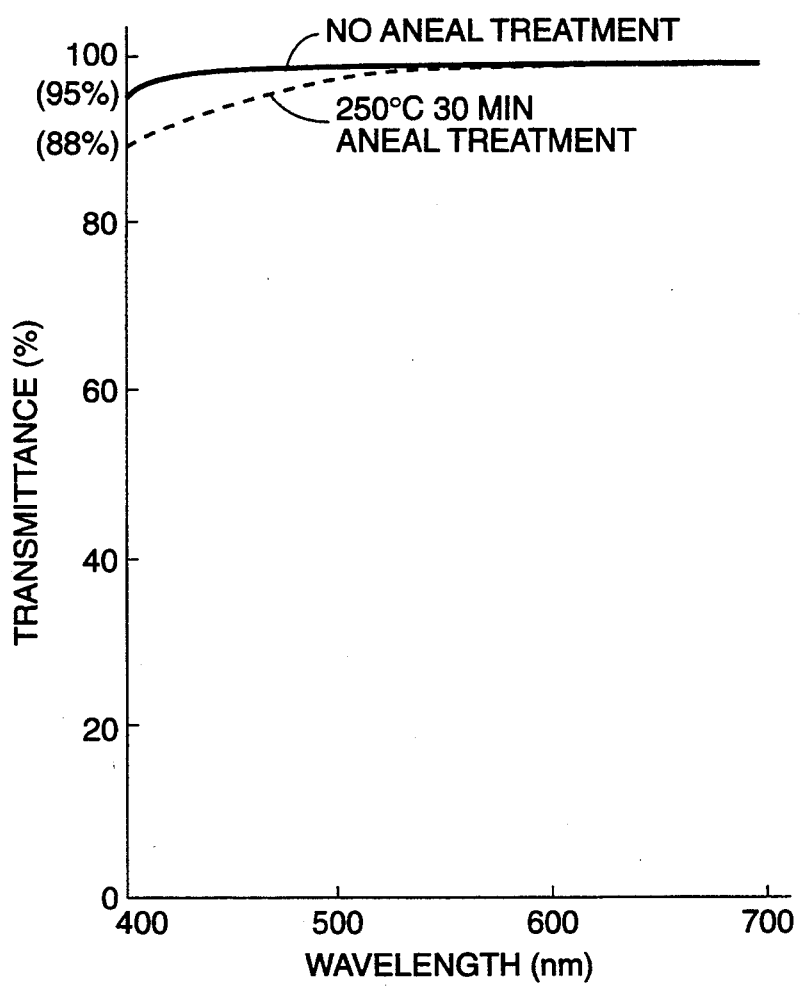
FIG. 15 shows curves of transmission of acrylic copolymer—diazo compound with respect to the wavelength of light.

The characteristics of the solid state imaging device may be enhanced by choosing a diazo compound which does not experience a decrease in transmission due to heat treatment. A typical example thereof is a polycondensation product consisting of diphenylamine—4—diazonium salt or its derivative, and 4.4'—bis—methoxylemethyl diphenylether. It is to be noted that the diphenylamine—4—diazonium salt or its derivative contains diphenylamine—4—diazonium salt and/or 3-methoxyl diphenylamine—4—diazonium. FIG. 15 represents a big difference in transmission when a condensation product consisting of diphenylamine—4—diazonium salt or its derivative 4.4'—bismethoxylmethyl diphenylether is used in place of the 4—diazo diphenylamine sulfate formaldehyde condensation product. In this case, there is no big difference in time to stabilize photo spectrography from the beginning of heat treatment, as compared with the 4—diazo diphenylamine sulfate formaldehyde condensation product used. While the 4-diazo diphenylamine sulfate formaldehyde condensation product changes up to 68% in transmission with heat treatment, the photo sensitizer condensed from diazo diphenylamine sulfate and 4.4'—bis—methoxylmethyl diphenylether changes only up to 88% with the same treatment and no change is observed with the latter in photo spectrography after this point.

The coloring by the diazo compounds as shown above is due to coupling reaction of diazo radicals which are undissolvable against sufficient photo bridging. Especially in the case of the aforementioned polycondensation products consisting of 4-diphenylamine sulfate formaldehyde condensation products and 4.4'—bis-methdoxymethyl diphenlether, hydrogen radicals existing in phenyl radicals, which exist only at the ortho or meta position, do not affect the coupling reaction. Only the coupling reaction between unreacted diazo radicals and amino radicals existing between phenyl radicals have an influence on coloring.

Figure 16:
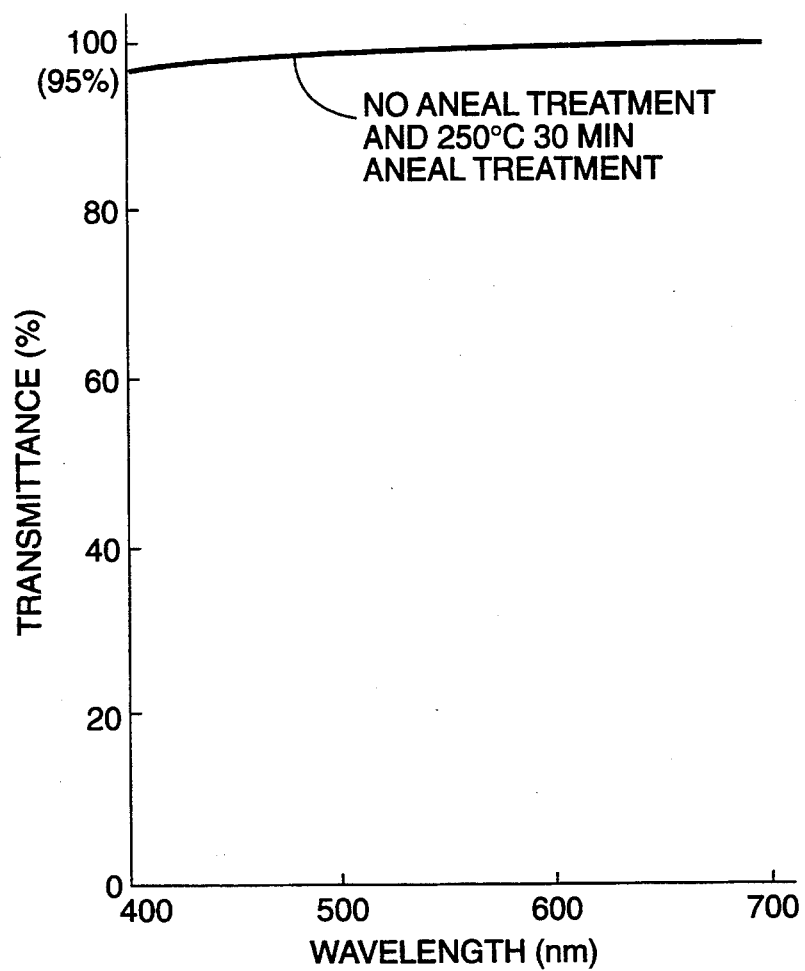
FIG. 16 shows curves of transmission of acrylic copolymer—diazo compound with respect to the wavelength of light.

Consequently, in diphenylamine—4—diazonium salt or its derivative, transmission will not change due to heat treatment by bonding other than amino radicals between phenyl radicals, as shown in FIG. 16. Some examples of such bonding are as follows:

$R_1$—($CH_2$) q—$R_1$ (q is an integer from 1 to 5.)
$R_1$—O—$R_6$—O—$R_1$ ($R_6$ is aryl containing 6 through 12 C-atoms.)
$R_1$—O—$R_1$
$R_1$—S—$R_1$ ($R_1$ is at least a phenyl radical)

As shown above, in the case where the diazo compounds having a little or no decline in transmission due to heat treatment is used to form the color filters 39 carried on the solid state imaging device, the amount of light entering the light-receiving sections 29 through the color filters 39 increases. The acrylic copolymer compounded with the diazo compounds similarly shows approximately 100% of transmission and does not experience decline in transmission even with repeated heat treatment. As a consequence, the diazo compounds described above enable the solid state imaging device to elevate its sensitivity by 10% or more.

Figure 17:
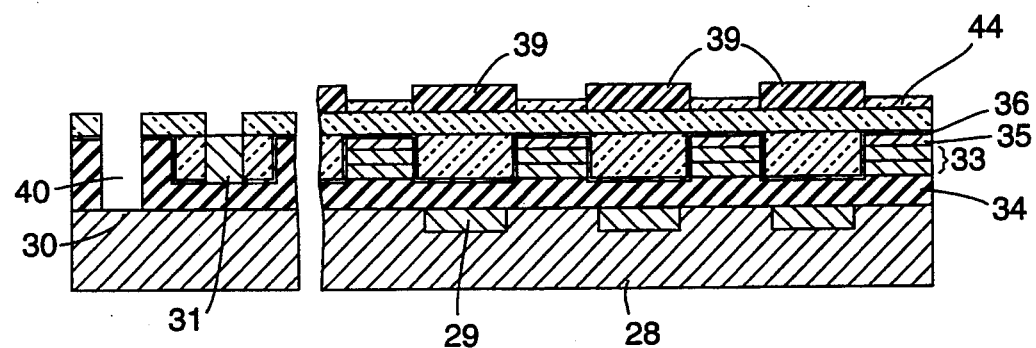
FIG. 17 shows a sectional view of a manufacturing method of a solid state imaging device in accordance with a second embodiment of the present invention.

FIG. 17 shows a manufacturing method of the solid state imaging device in accordance with a second embodiment of the present invention. The manufacturing steps in the first embodiment until each color filter 39 of red, green and blue is formed are applicable to the second embodiment. In the second embodiment, black stripes 44 or light shield filter are formed to cover the areas where the color filters 39 are not placed, in order to restrain so-called stray light from entering each light-receiving sections 29 through the areas. This arrangement improves imaging characteristics and eliminates smear or flare. The black stripes 44 are also made of the synthetic photosensitive material of black color using water for a solvent. This material enables the black stripes to be uniform and excellent in shape or topography, as compared with conventional stripes 44 which are made by compounding the natural protein with the dichromate. In the conventional device, the edges of patterns are dull so that the black stripes may cover the light receiving sections. However, this embodiment of the present invention eliminates such possibility. Accordingly, the solid state imaging device according to this embodiment achieve higher sensitivity.

Figure 18:
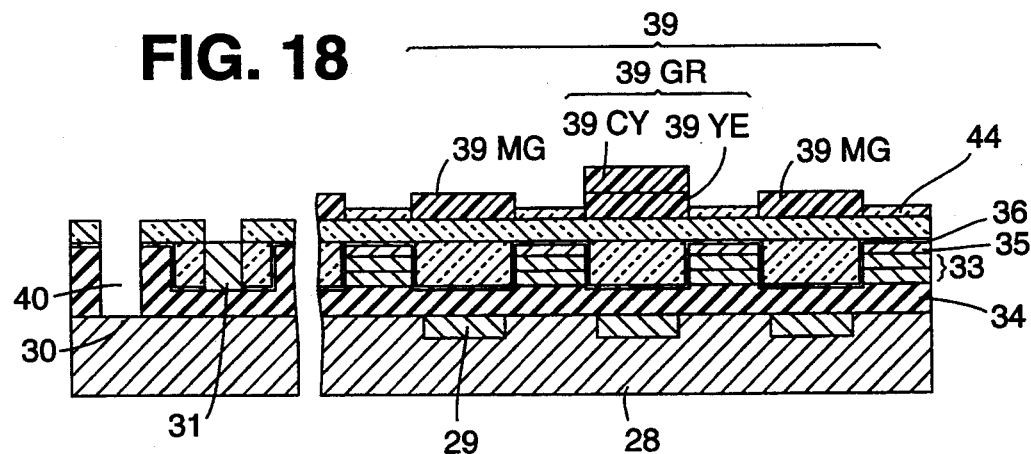
FIG. 18 shows a sectional view of a manufacturing method of a solid state imaging device in accordance with a third embodiment of the present invention.

FIG. 18 shows a manufacturing method of the solid state imaging device in accordance with a third embodiment of the present invention. This embodiment shows a way of forming color filters 39MG, 39CY, 39GR, and 39 YE of magenta, cyan, green, and yellow in place of forming the color filters 39 of the three primary colors of red, green, and blue respectively. In this example, green color is produced by combining yellow and cyan.

This method also enables to form color filters with uniformity both in shape and photo spectrography and the sold state imaging device with such color filters exhibits excellent characteristics free of shading, flickers, color-mixture, white specks, and so forth.

The synthetic photosensitive materials including water as a solvent in this embodiment does not form a mixed layer with any transparent flattening material including organic solvents. In addition to the positive photosensitive thermosetting material, non-photosensitive thermosetting materials which are hardened by heat treatment and negative type materials which are hardened with heat treatment and show negative sensitivity (called the negative photosensitive thermosetting material) may be used in the above embodiment.

Referring to FIGS. 19 through 32, a description will be given of a solid state imaging device which is formed of negative synthetic material including an organic solvent as developer through drying etching, and a method of manufacturing the same.

In these embodiment, excellent uniformity on the surface is achieved by applying color filter material on the surface of a transparent flattening layer through the use of an organic solvent with excellent volatility. Where the material of natural protein and dichromate is applied to form a color filter of thickness of 0.7 $\mu$m on a wafer of 6 inches, variation in layer thickness (maximum—minimum) shows 0.08 through 0.10 $\mu$m. On the contrary, where the synthetic photosensitive material of water solubility is used, the variation is improved in the order of only 0.01 through 0.02 $\mu$m. Furthermore, where the synthetic photosensitive material includes an organic solvent, a highest uniformity in flatness is achieved in the order of less than 0.005 $\mu$m. Accordingly, the above material is excellent in controllability on patterning and dyeing characteristics.

Figure 19:
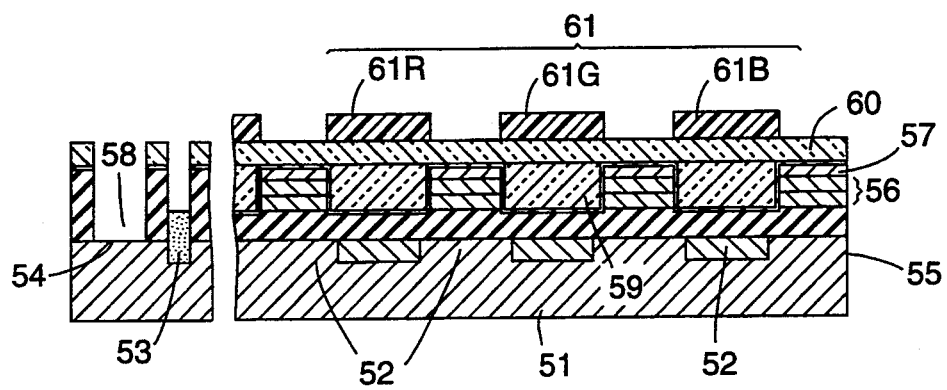
FIG. 19 shows a sectional view of structure of the solid state image device in the second embodiment of the present invention.

FIG. 19 shows a structure of a color solid state imaging device according to another embodiment of the present invention. A semiconductor substrate 51 is P-type and light-receiving sections 52 are N-type in the solid state imaging device. The device also include bonding pads 53 and scribe lines 54. Double-layer transfer electrodes 56 with an insulating layer 56 such as $SiO_2$ are disposed on each surface of electric charge transfer sections 55 located between the adjacent light-receiving sections 52 on the semiconductor substrate 51. Light-shielding metal layers 57 are formed to cover the surfaces of the transfer electrodes 56 to prevent the external light from entering the electric charge transfer sections 55.

The gap between the scribe line 54 and the protecting layers 56 mounted on the insulating layer is 1.5–2.0 $\mu$m, and the gap between protecting layers 56 above the light-receiving sections 52 and the other protecting layers 56 on the light-shielding metal layers 57 is 0.8 through 1.5 $\mu$m. Under the circumstance, a resist may get caught by the gaps and causes uneven application just like tails left in applying the material above the light-receiving sections directly to form color filter 61, so that color filters 61 are not formed into uniform shape. Transparent gap filler layers 59 are formed on the light-receiving sections 52 to make top surfaces of the light-receiving sections flush with the light-shielding metal layers 57. In order to smooth the gap between the transparent gap filler layers 59 and the light-shielding metals 57 with higher precision, a transparent flattening layer 60 is formed on the surface of the transparent gap filler layers 59 and the light-shielding metal layers 57. This transparent flattening layer 60 is made of non-photosensitive thermosetting material or negative type photosensitive thermosetting material. Color filters 61R, 61G and 61B of red, green, and blue are formed on a surface of the transparent flattening layer 60 to provide the imaging device with color function. The color filters 61 are positioned facing each of the light-receiving sections. Accordingly, each of the light-receiving sections receives monocolor light.

The synthetic photosensitive materials as described in the first through third embodiments are used for the color filters 61. The synthetic photosensitive materials are prepared by bonding or dispersing materials having functions necessary for the color filters 61. For instance, the materials may be made dyeable by combining materials which couple with dyestuffs, such as Quaternary ammonium salt. The materials may contain coloring material by bonding or dispersing dyestuffs or pigments suitable for desired photo spectrography. It is generally known that the natural protein is a water-soluble polymer and photo sensitizers to be combined into the natural protein are limited to cross-link type such as dichromate acid salts, diazo compounds, and azide compounds. Especially, each of the light-receiving sections 21 in the solid state imaging device is as small as a few $\mu$m, so that only the dichromate salt out of the above listed synthetic photosensitive materials may be used in order to secure satisfactory resolution. However, the synthetic photosensitive materials can be water-soluble or non-water-soluble, according to methods of combining the components and choice of the component materials. The synthetic photosensitive materials may be either of the negative type of light cross-link containing the natural protein and the dichromate or of the positive type.

In particular, the time for formation of the layers and the time for evaporation of the solvent are well balanced and the layers formed are even and free of rugged surfaces where rotary application is used to form the layers at 1000 through 5000 rotations per minute, through the use of the photosensitive materials with an organic solvent consisting of alcohol group or cellosolve group out of the above described combination of the solvents.

The color filter materials used in the above embodiment are dyeable with combination of material which may bind with dyestuffs and of the negative type of synthetic photosensitive material with the organic solvents. The structure of the materials is an acrylic co-polymer including hydroxy ethyl methacrylate and dimethyl amino methacrylate as its fundamental component. In order to facilitate cross-link, azide compounds are combined, which cross-link the acrylate exposed to I-rays. Ethylcellosolve is employed as a solvent.

A description will be now given of a manufacturing method of a solid state imaging device in accordance with a fourth embodiment of the present invention, with reference to FIGS. 20 through 30.

Figure 20:
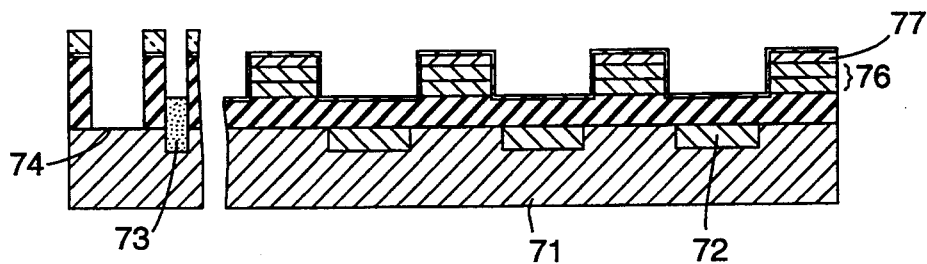
FIG. 20 shows a sectional view of a manufacturing method of a solid state imaging device in accordance with a fourth embodiment of the present invention.

As shown in FIG. 20, a number of light-receiving sections 72 are formed by doping an N-type impurity into desired positions on a P-type semiconductor substrate 71 of silicon or the like. Transfer electrodes 76 and light-shielding metal layers 77 are formed on a surface of the semiconductor substrate 71.

As shown in FIG. 20, in order to fill the largest gap in the solid state imaging device located between scribe lines 74 and the light-shielding metal layers 77, a gap filler layer 78 is formed by means of rotary application. The gap filler material is applied so as to make the level of the filled and elevated light-shielding metal layers 77 flush with the top surface of the gap filler layer 78. After the rotary application, heat treatment is effected to evaporate a solvent contained in the material. All of the material except in the gap on the scribe line 74 and the light-shielding metal layers are removed.

In the case that a negative type photosensitive materials is used for the gap filler layer 78, removal is done by exposing required areas to light and developing the same. In the case that a positive synthetic material is used, removal is done by exposing non-required areas to light and developing the same. Furthermore, in the case that the material does not assume sensitivity, removal is done by means of a dry etching method such as $O_2$ ashing using an oxygen plasma.

Figure 22:
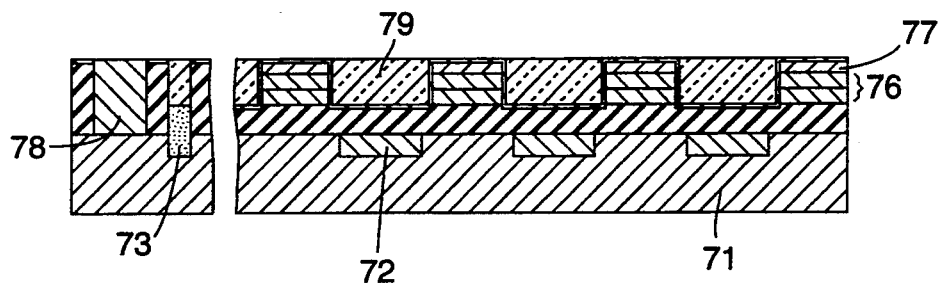
FIG. 22 shows a sectional view of the manufacturing method of the solid state imaging device in accordance with the fourth embodiment of the present invention.

The next step of FIG. 22 is to form a transparent gap filler layer 79 by rotary application to fill the gap between the light-receiving sections 72 and the light-shielding metal layers 77. This step is same as the step of FIG. 3 by which the gap between the above scribe lines 74 and the light-shielding metal layers 77 is filled.

Figure 21:
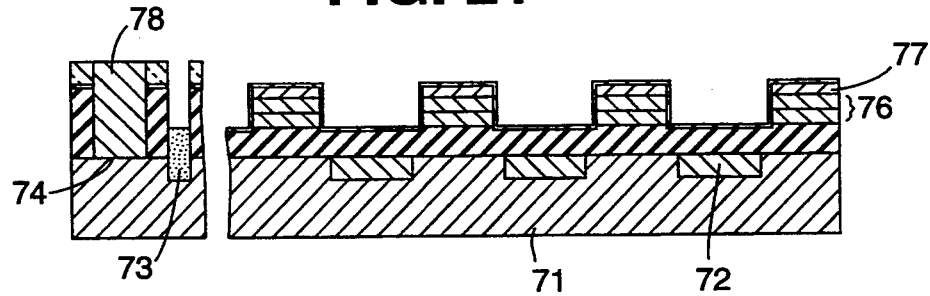
FIG. 21 shows a sectional view of the manufacturing method of the solid state imaging device in accordance with the fourth embodiment of the present invention.

The other gaps in the solid state imaging device are treated in the same process as shown FIGS. 21 or 22, or are treated by a separate step in the same manner.

Figure 23:
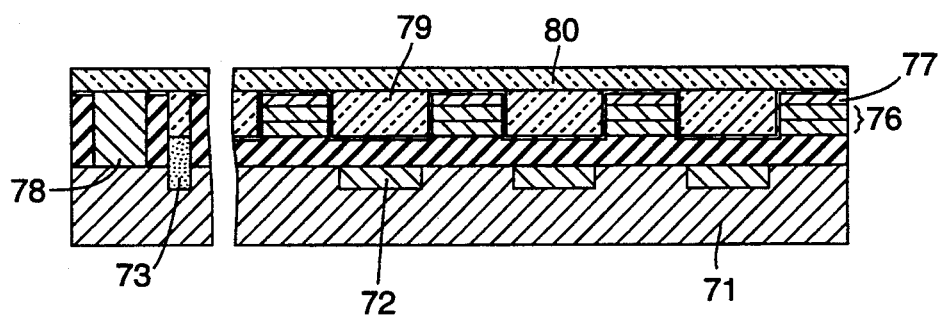
FIG. 23 shows a sectional view of the manufacturing method of the solid state imaging device in accordance with the fourth embodiment of the present invention.

FIG. 23 illustrates that the gap filler layer 78 and the transparent gap filler layers 79 formed in the steps of FIGS. 20 and 21 are not on the same level as the light-shielding metal layers 77 and therefore the flatness of the working surface of the device is low. Accordingly, to make even the gaps between the gap filler layer 78, the transparent gap filler layers 79, and the light-shielding metal layers 77, a transparent flattening layer 80 is formed by rotary application so that the top surface of the solid state imaging device is made completely flat. After the transparent flattening layer 80 is rotatively applied, heat treatment is carried out to evaporate solvents contained in materials. This transparent flattening layer 80 is to be in touch with color filters. Therefore, in the case that color filter materials with an organic solvent of strong solubility are applied in the following steps, the transparent flattening layers 80 may be dissolved in the organic solvent, thereby forming a mixed layer between the transparent flattening layer 80 and color filter base layers.

For this reason, when the color filters are formed through heat treatment following the deposition of the color filter base layer 81, light exposure, development, and post-development heat treatment, it is impossible to remove the mixed layer remaining in the unexposed areas. If dyeing process is carried out as it is, the remaining mixed layer is also dyed. Accordingly, when the second or third color filter is formed after the formation of the first color filter, the mixed layer colored during the formation of the first color filter still remains at the interface between the second or the third color filter and the flattening layer 80. Consequently, color mixing takes place only to cause inferior picture.

For the reason as discussed above, the material for the transparent flattening layer is required to show excellent flatness of a layer resulting from rotation application thereof and exhibit such a resistance to the organic solvent in the color filter base layers that the transparent flattening layer 80 formed is not dissolved into the solvent in the color filter material.

In order to achieve such excellent flatness, it is preferable that the material for the transparent flattening layer use an organic solvent having high volatility such as alcohol group or cellosolve group with high volatility, as does the color filter material. Ethyl cellosolve acetate is actually adopted in the above embodiment. The material which is hardened with heat treatment and of either non-photosensitive type or negative type is required.

Non-photosensitive thermosetting material which proceeds with hardening reaction in all of the constitutional components provides a high degree of film hardness. An example of this material is polyglycidyl methacrylate. Polyglycidyl methacrylate is positively sensitive to some extent in the side of short wavelength but not in the wavelengths of G-rays, I-rays, or short wavelength ultraviolet-rays (Deep-UV), making patterning impossible in those sides of wavelength. Heat treatment at a temperature of 150° C. or more increases layer hardness due to heat cross-link and also enhances resistance to an organic solvent. The achieved layer hardness is harder than pencil hardness H.

The negative photosensitive thermosetting material makes cross-link with light exposure, lowering its solubility to the solvents. The result is increases in its layer hardness and its resistance to organic solvents. Examples of this material are material including polyglycidyl methacrylate and 4" methacryloylo oxy chalone in its fundamental structure.

This material proceeds with thermosetting reaction of polyglycidyl methacrylate in response to heat treatment and the material in chalcone group, when exposed to short wavelength ultraviolet rays, exhibits dimerization due to double coupling in benzylic acetophenone group in the 4" methoxy oxy chalone chain.

4" methacryloylo oxy chalone is absorbed in shorter wave-length side than I-rays but is not absorbed in the visible light range, like polyglycidyl methacrylateas. If sufficient resistance to organic solvents is not provided by heat treatment alone in the steps of the drawings, layer hardness is enhanced by light exposure to improve the resistance to organic solvents. The achieved layer hardness is harder than pencil hardness H, as the non-photosensitive thermosetting material does. A mixed layer may be prevented from developing by the choice of material and steps as shown above.

Figure 24:
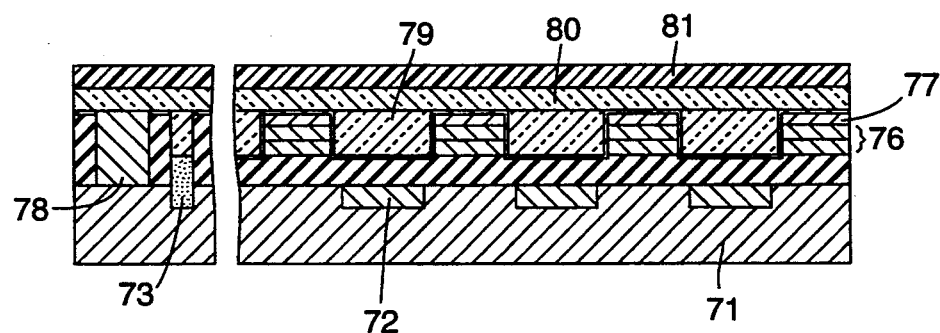
FIG. 24 shows a sectional view of the manufacturing method of the solid state imaging device in accordance with the fourth embodiment of the present invention.

Thereafter, as shown in FIG. 24, the color filter base layer 81 is formed on the transparent flattening layer by means of rotary application. Heat treatment is then carried out for a few minutes at a temperature of 70° through 100° C. to evaporate a solvent.

Figure 25:
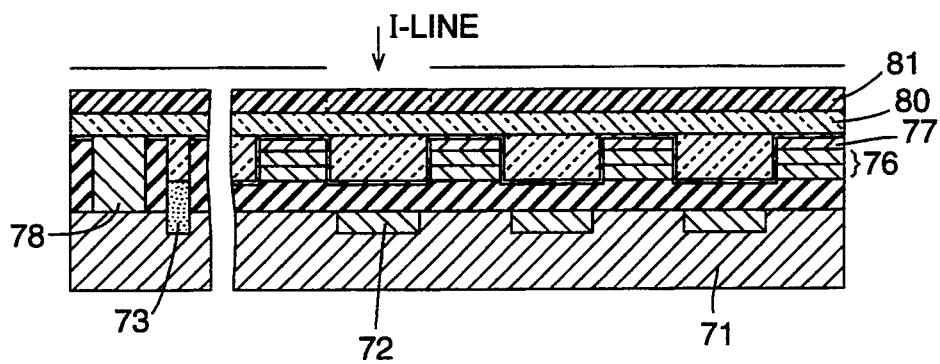
FIG. 25 shows a sectional view of the manufacturing method of the solid state imaging device in accordance with the fourth embodiment of the present invention.

Then, as shown in FIG. 25, the color filter base layer 81 is exposed to I-rays via a desired patterning mask as a photo mask.

Figure 26:
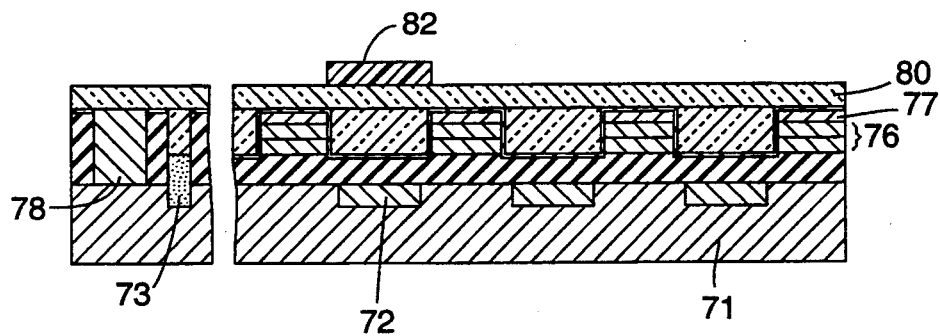
FIG. 26 shows a sectional view of the manufacturing method of the solid state imaging device in accordance with the fourth embodiment of the present Invention.

The next step of FIG. 26 is to dissolve the unexposed areas of the color filter base layer 81 into a developer in alcohol group such as isopropyl alcohol or ethanol. After the dissolution, the developer is removed and heat treatment is followed for a few minutes at a temperature of approximately 150° C. The color filter pattern 82 is developed through these steps.

Figure 27:
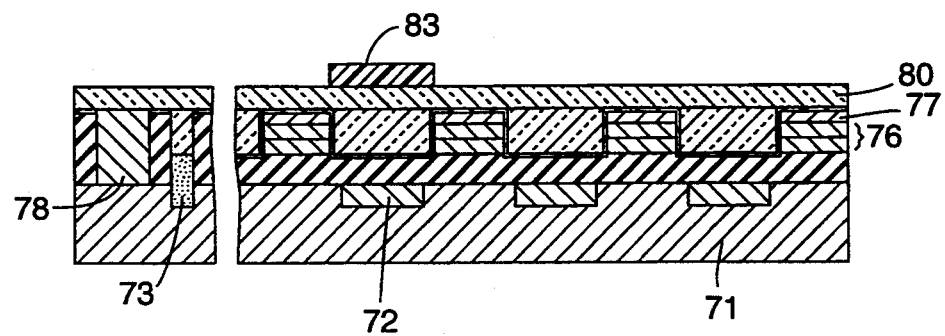
FIG. 27 shows a sectional view of the manufacturing method of the solid state imaging device in accordance with the fourth embodiment of the present invention.

The next step of FIG. 27 is to dip the finished color filter pattern 82 in dyestuffs and wash and dry the same. Dyeing takes place to form the color filters by coupling of dyeing radicals included in the color filter pattern 82 and dyestuffs. Furthermore, if fixing treatment is carried out on the color filters, the color filters will never be dyed again when being soaked in the next dyestuff and will stay unchanged. As an example, this fixing treatment is achieved by dipping the col. or filters in an aqueous tannin acid solution and then an aqueous antimony potassium tartrate solution.

Figure 28:
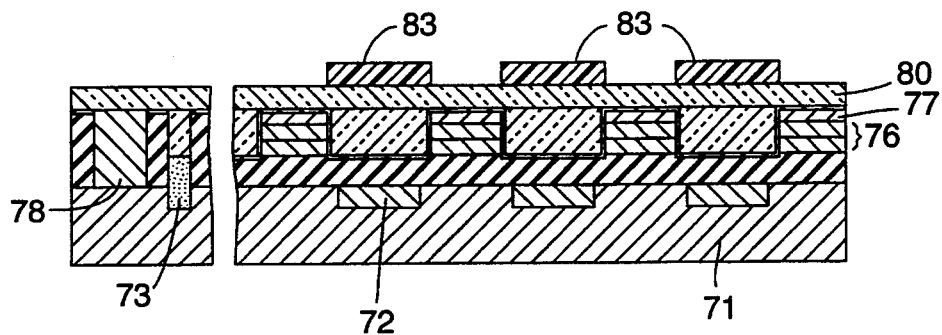
FIG. 28 shows a sectional view of the manufacturing method of the solid state imaging device in accordance with the fourth embodiment of the present invention.

As is obvious from FIG. 28, the steps of FIGS. 24 through 26 are repeated so as to form the second and third color filters 83.

Figure 29:
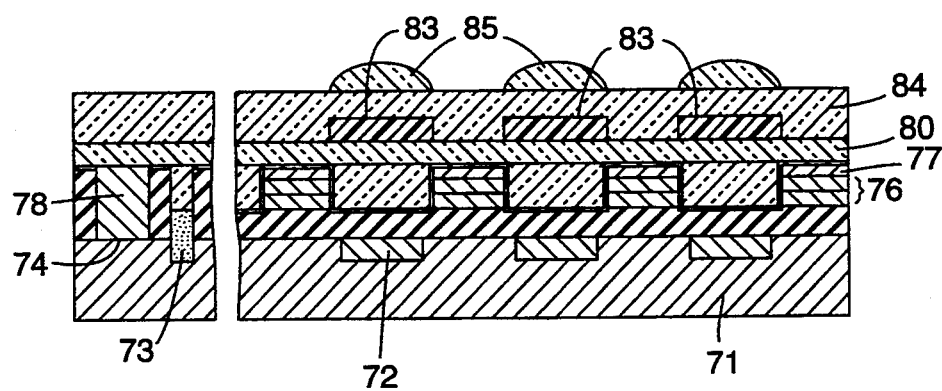
FIG. 29 shows a sectional view of the manufacturing method of the solid state imaging device in accordance with the fourth embodiment of the present invention.

The step of FIG. 29 is to form a transparent flattening layer 84 on the color filters 83, subsequently to the formation of all of the color filters 83. Micro lenses 85 are formed in order to improve the sensitivity of the solid state imaging device. The transparent flattening layer 84 mounted on the color filters 83 does not need sensitivity, unlike the underlying transparent flattening layer 80.

Figure 30:
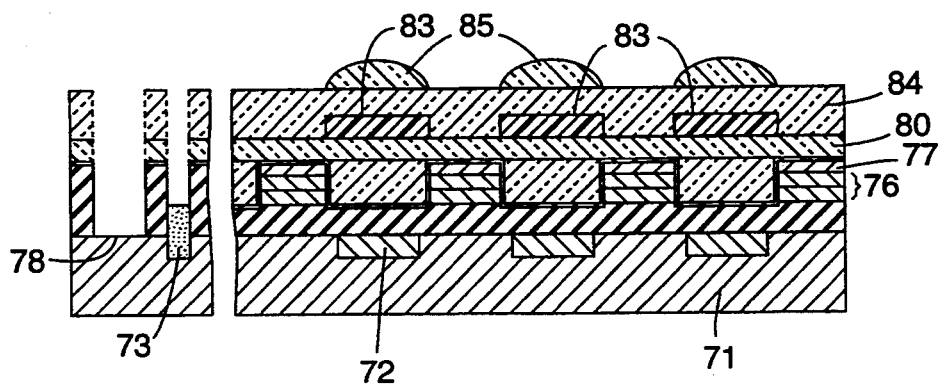
FIG. 30 shows a sectional view of the manufacturing method of the solid state imaging device in accordance with the fourth embodiment of the present invention.

The final step of FIG. 30 is to remove the transparent flattening layers 80 and 84 and the gap filler layer 74 on the bonding pad 73 as the external line connection and on the scribe lines 74. The transparent flattening layers 80 and 84 and the gap filler layers 78 are removed by means of dry etching method such as $O_2$ ashing with oxygen plasma.

The gaps on the surface of the light-shielding metal layers 77, the light-receiving sections 72, and the scribe line 74 in the solid state imaging element manufactured are finely flattened through the above steps By rotating application of the synthetic photosensitive materials using the organic solvent of excellent uniformity on the surface of the finely flatted transparent flattening layer 80, the color filters 83 are made free of unevenness. Furthermore, the removing of the gap filler layer 78 between the scribe line 14 and the bonding pads 73, and the transparent flattening layers 80 and 84 at the final step of the manufacturing process, prevents uneven application during rotary application on color filters and thinning of the color filter layer 83 in the areas where the gaps are closed each other. Consequently, the color filters formed from the above-mentioned color filter base layers 81 of evenness show excellent uniformity in shape or topography.

The conventional material of natural protein such as gelatin or casein and dichromate as a photo sensitizer, experienced a considerable timewise change due to dark reaction during the manufacturing of the color filters. Even if the steps of application, exposure, development, and dyeing were controlled in terms of minutes, it was difficult to form a color filter 83 uniformly on a solid state imaging device.

The diazo compounds used for the synthetic photosensitive material accordance with the present invention show an extremely slow timewise change in organic solvents and hardly change during the manufacturing of the color filters. Accordingly, each of the color filters (monocolor) formed in the imaging device is excellent in uniformity of shape. Dying performance is subject to no or less variation due to the different materials.

For the reasons described above, the color filters in a single color carried on the solid state imaging device exhibit excellent uniformity in shape and photo spectrography. Therefore, the solid state imaging device is excellent in shading characteristics, free from irregularity in shape or variation of photo spectrography.

The non-photosensitive thermosetting material or negative photosensitive material used for the transparent flattening layer 80 prevents formation of a mixed layer. Therefore, no inferior image with mixed colors caused by a colored mixed-layer is observed.

The synthetic photosensitive materials having solubility to organic solvents, as used in the embodiments of the present invention, show the characteristics of light cross-link. The diazo compounds and azide compounds are known as a light cross-link sensitizer having of solubility to organic solvents. The diazo compounds are different in sensitive wavelength range, heat stability, and choices of cross-linking polymers, according to the structure thereof. The compounds may be made water-soluble or soluble to organic solvents according to choice of the kind of counter anion. The azide compounds are likewise different in sensitive wavelength range, heat stability, and choices of bridge-formable polymers, according to the structure thereof. In addition, it shows the highest cross-link characteristics to non-water-soluble polymers. Of all of the above materials, the azide compounds show high cross-linking efficiency toward the synthetic organic solvent-soluble polymers compounded for the color filter materials and provide high resolution. They show superior resolution, as compared to the conventional color filter materials of the natural protein compounded with dichromate.

Furthermore, the above illustrated embodiments of the present invention employs the so-called fixing method, by which to fix the color filter 83 after being formed. Other methods; to form color filters 83 involve a protecting layer method by which dye-preventing layers are formed every time after forming color filters 83 and a window method by which the color filter pattern 82 is formed uniformly on the transparent flattening layer 80 and a transparent film is formed thereon to protect from color mixing with a window opened for dying only desired areas of the color filter patterns 82.

Figure 31:
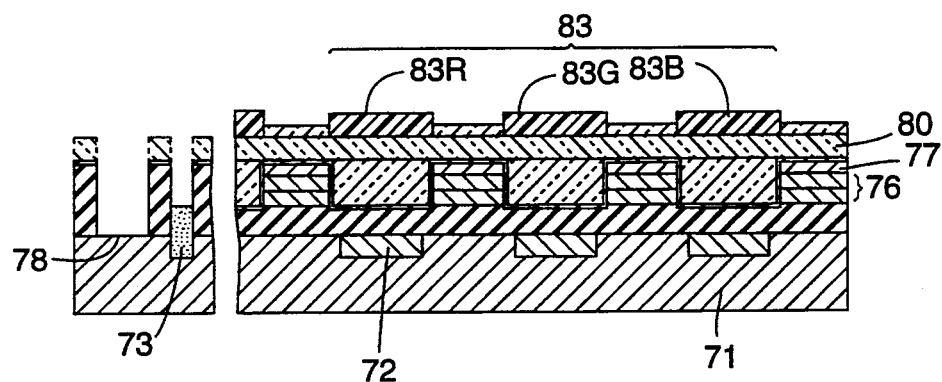
FIG. 31 shows a sectional view of a manufacturing method of the solid state imaging device in accordance with a fifth embodiment of the present invention.

FIG. 31 shows a manufactured method of a solid state imaging device in accordance with a fifth embodiment of the present invention. The same method as for the color filters 83R, 83G, and 83B of red, green and blue is applied to form stripe patterns 86 or light shield filter to rid the image characteristics of smear or flare or the like. In this case, the stripe patterns 86 of excellent shape are formed, as compared with the conventional stripe patterns 86 of the natural protein combined with dichromate. It is not possible that the stripe patterns 86 may cover the light-receiving sections 72, so that the solid state imaging device exhibits higher sensitivity.

Figure 32:
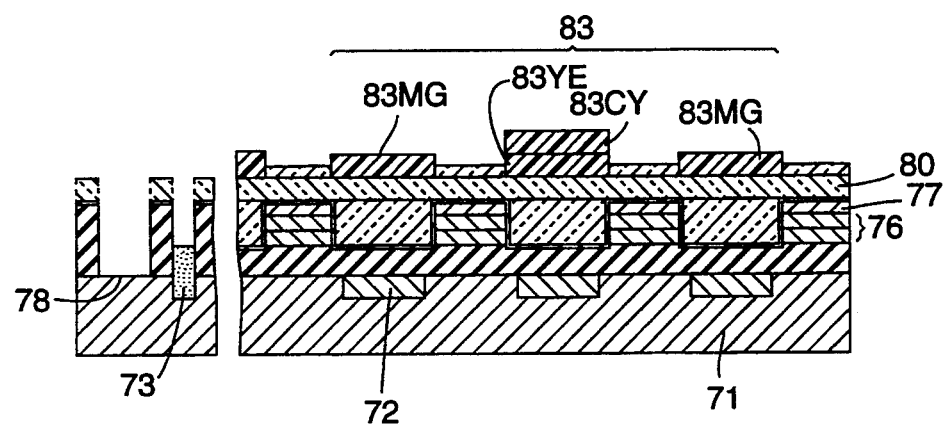
FIG. 32 shows a sectional view of a manufacturing method of the solid state imaging device in accordance with a sixth embodiment of the present invention.
Figure 33:
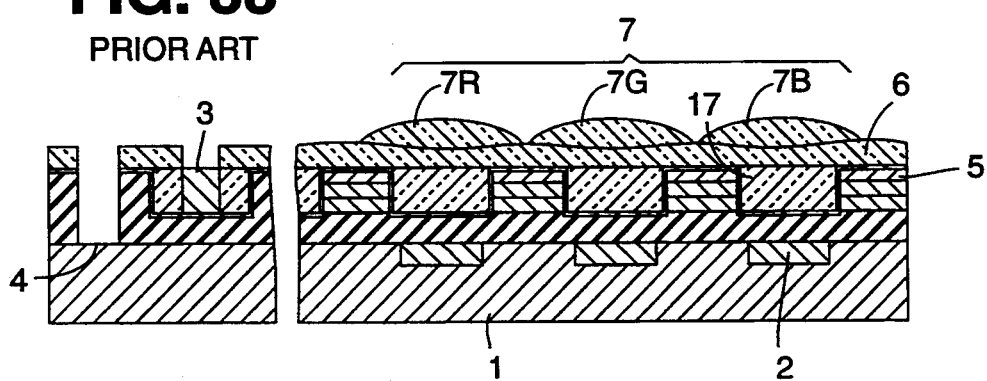
FIG. 33 shows a view of structure in a solid state imaging device of prior art.

FIG. 32 shows a manufacturing method of a solid state imaging device in accordance with a sixth embodiment of the present invention. This embodiment uses color filters 83MG, 83CY, 83GR and 83YE of magenta, cyan, green, and yellow in place of the three primary colors of red, green and blue in the previous embodiments. In this case, green color is generated by combining yellow and cyan. This method provides the color filters 23 of uniformity both in shape and photo spectrography. The present invention provides the solid state imaging device with excellent characteristics in sensitivity, free of shading, flickers, color-mixing and so forth.

The present invention has been described in detail for a clear understanding, with reference to the embodiments thereof and the drawings. It is obvious that some changes or modification are possible therein within the scope of the appended claims.

As is understood from the above description, the present invention provides the color filters on the surface of the finely flattened transparent layer mounted on the solid state imaging device, using the synthetic photosensitive materials with excellent uniformity of its application and stability on time. Each of the color filters in a single color on the solid state imaging device using the synthetic photosensitive material is excellent in shape and photo spectrography, while meeting the demand of downsizing and a higher number of pixies in the solid state imaging device. The solid state imaging device provides prominent image characteristics which are free of color mixing or inferiority in flickers or shading caused by non-uniform shape or difference of photo spectrography in the color filters and also image inferiority due to particles or white blemish.

Therefore, the spirit and scope of the appended claims should not be limited to the description of the preferred versions contained herein.

What is claimed is:

1. A solid state imaging device comprising:
 a semiconductor substrate carrying a transfer section and a light-receiving section;
 a transparent gap filler layer and a transparent flattening layer mounted on the semiconductor substrate;
 a color filter formed of a synthetic photosensitive material formed on said transparent flattening layer.

2. A solid state imaging device according to claim 1, wherein said transparent gap filler layer and said transparent flattening layer are made of positive photosensitive thermosetting material.

3. A solid state imaging device according to claim 2, wherein said positive photosensitive thermosetting material is are copolymers of polymethyl methacrylate and polyglycidyl methacrylate.

4. A solid state imaging device according to claim 1, wherein said color filter is formed of synthetic photosensitive materials containing water as a solvent.

5. A solid state imaging device according to claim 1, wherein said transparent flattening layer is made of non-photosensitive thermosetting material and said color filter is made of synthetic photosensitive materials containing an organic solvent as solvent.

6. A solid state1236Ximagedevice according to claim 1, wherein said transparent flattening layer is made of negative photosensitive thermosetting material and said color filter is are made of synthetic photosensitive material containing an organic solvents as solvent.

7. A solid state imaging device according to claim 5, wherein said color filter is formed of synthetic photosensitive materials containing an azide compound of cross-link and an organic solvent as solvent.

8. A solid state imaging device according to claim 4, wherein the synthetic photosensitive material for said color filters contains in water an acrylic copolymer, oxy poly basic acid salt and a diazo compound of light cross-link type.

9. A solid state imaging device according to claim 8, wherein said acrylic compound contained in the synthetic photosensitive material for the said color filter is represented by the following general expression in the range of 5000 through 100000 of average molecule weight:

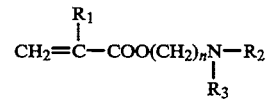

where $R_1$ represents a hydrogen atom or $CH_3$, $R_2$ and $R_3$ represent an alkyl group or allyl group such as $CH_3$, $C_2H_5$, $C_6H_5$ and the like independently, and n represents an integer from 1 to 10; and said acrylic compound comprises 5-20 weight % of a monomer, 45-55 weight % of 2-hydroxy ethyl methacrylate; 20-30 weight % of methacrylic amide; and 5-10 weight % of benzylic methacrylate.

10. A solid state imaging device according to claim 8, wherein said diazo compound contained in the synthetic photosensitive materials for said color filters comprises a polycondensation product including diphenylamine—4—diazonimum salt or its derivative and formaldehyde.

11. A solid state imaging device according to claim 8, wherein said diazo compound contained in the synthetic photosensitive material for said color filters comprises a polycondensation product including dephyndylamine—4—diazonium salt or its derivative, and 4.4'—bis—methoxylmethyl diphenylether.

12. A solid state imaging device according to claim 8, wherein said diazo compound contained in the synthetic photosensitive material for said color filter comprises a compound not including an amino radical.

13. A solid state imaging device according to claim 10, wherein said diphenylamine—4—diazonium salt or its derivative includes diphenylamine—4—diazonium salt and/or 3—methoxyl diphenylamine—4 diazonium chloride.

14. A solid state imaging device according to claim 12, wherein said diazo compound contained in said synthetic photosensitive materials for said color filter include one or more couplings out of
 —C(CH₂)q— (q is an integer from 1 to 5) or
 —O—R6—O— (R₆ through 12C—carbon atoms or aryl) or
 —O—or
 —S— in said diphenylamine—4—diazonium salt or phenyl radicals in its derivative,

15. A method of manufacturing a solid state imaging device comprising the steps of:
- forming a gap filler layer between a scribe line and a protecting layer mounted on a semiconductor substrate, using positive photosensitive thermosetting material;
- forming a transparent gap filler layer between the protecting layers on an insulating layer covering the semiconductor substrate and the protecting layers on light-shielding metal layers using positive photosensitive thermosetting material;
- forming a transparent flattening layer on a surface of the gap filler layer, the transparent gap filler layers and the protecting layers, using positive photosensitive thermosetting material;
- forming color filters on a surface of the transparent flattening layer by means of exposure and development, using synthetic photosensitive material containing water as a solvent; and
- removing the gap filler layer and the transparent flattening layer mounted on the scribe line and the bonding pad by means of exposure and development.

16. A method of manufacturing a solid state imaging device according to claim 15, wherein the step of forming the color filters on the surface of said transparent layer by means of irradiation and development using the synthetic photosensitive material containing water for solvent, forms the color filters by means of coloring with desired dyestuffs after the color filter patterns are formed.

17. A method of manufacturing a solid state imaging device comprising the steps of:
- forming a gap filler layer between a scribe line and a protecting layer mounted on a semiconductor substrate;
- forming transparent gap filler layers between the protecting layers mounted on an insulating layer covering the semiconductor substrate and the protecting layers on light-shielding metal layers;
- forming a transparent flattening layer on a surface of the gap filler layer, the transparent gap filler layers and the protecting layers, using non-photosensitive thermosetting material;
- treating the transparent flattening layer with heat to form color filters on a surface of the transparent flattening layer, using synthetic photosensitive material containing an organic solvent; and
- removing the transparent flattening layer on bonding pads and the gap filler layer on the scribe line by means of dry etching.

18. A method of manufacturing a solid state imaging device comprising the steps of:
- forming a gap filler layer between a scribe line and a protecting layer mounted on a semiconductor substrate;
- forming a transparent flattening layer on a surface of the gap filler layer, the transparent gap filler layers and the protecting layers, using negative thermosetting material;
- treating the transparent flattening layer with heat and/or radiation exposure;
- forming color filters on the transparent flattening layer, using synthetic photosensitive material containing an organic solvent; and
- removing the transparent flattening layer formed on bonding pads for the solid state imaging device and the gap filler layer on the scribe line by means of dry etching.

19. A dyeable synthetic photosensitive material for color filters on a solid state imaging device which is dissolved into water with a solvent of:
- an acrylic copolymer consisting of 5–20 weight % of monomer as shown by the following general formula within a range of mean molecular weight from 5000 to 100000 where $R_1$ represents a hydrogen atom or $CH_3$, $R_2$ and $R_3$ represent an alkyl group or allyl group such as $CH_3$, $C_2H_5$, $C_6H_5$ and the like independently, and n represents an integer from 1 to 10; 45–55 weight % of 2-hydroxy ethyl methacrylate; 20–30 weight % of methacrylic amide; and 5–10 weight % of benzylic methacrylate; and
- oxy poly basic acid salt and a diazo compound.

20. A method of manufacturing a solid state imaging device which comprises the steps of:
- preparing a substrate having at least light receiving sections and charge transfer sections;
- forming light-shield material on the charge transfer sections;
- covering the light receiving sections and the charge transfer sections with a protecting layer;
- forming a transparent gap filler layer of photosensitive thermosetting material on the protecting layer in the light receiving sections;
- forming a transparent flattening layer of photosensitive thermosetting materials on the transparent gap filler layer and the protecting layer in the charge transfer sections; and
- forming color filters of synthetic photosensitive material with a water solvent, on the surface of the transparent flattening layers.

21. A method of manufacturing a solid state imaging device according to claim 20 wherein the color filters are formed through light exposure and development techniques.

22. A method of manufacturing a solid state imaging device which comprises the steps of:
- preparing a substrate having at least light receiving sections and charge transfer sections, said substrate further having bonding pads for external connection of the solid state imaging device and a scribe line for separation of the solid state imaging device into individual solid state imaging units;
- forming light-shield material on the charge transfer sections;
- covering the light receiving sections and the charge transfer sections with a protecting layer;
- forming a transparent gap filler layer of positive type photosensitive thermosetting material on the protecting layer in the light receiving sections;
- forming a transparent gap filler layer of photosensitive thermosetting material in the scribe line and in the bonding pads; forming a transparent flattening layer of photosensitive thermosetting materials on the transparent gap filler layer and the protecting layer in the charge transfer sections;
- forming color filters of synthetic photosensitive material with a water solvent, on the surface of the transparent flattening layers; and
- removing the gap filler layer and the transparent flattening layer from the scribe line and the bonding pads.

23. A solid state imaging device comprising:
a semiconductor substrate carrying a transfer section and a light-receiving section;
a flattening layer mounted on the semiconductor substrate for flattering a surface of the transfer section and a surface of the light-receiving section, said flattering layer including thermosetting material;
a color filter formed on said transparent flattening layer, said color filter including synthetic photosensitive material and being colored to manifest a desired photo spectrograph, said synthetic photosensitive material containing water as solvent,
wherein the thermosetting material in the flattening layer is selected not to dissolve into the synthetic photosensitive material.

* * * * *

UNITED STATES PATENT AND TRADEMARK OFFICE
CERTIFICATE OF CORRECTION

PATENT NO. : 5,404,005
DATED : April 4, 1995
INVENTOR(S) : Koji Shimomura; Yoshikazu Sano It is certified that error appears in the above-indentified patent and that said Letters Patent is hereby corrected as shown below:

On the title page change attorney as below :
--Rogers & Wells--.

Signed and Sealed this

Thirteenth Day of June, 1995

*Attest:*

BRUCE LEHMAN

*Attesting Officer*  *Commissioner of Patents and Trademarks*